United States Patent
Tomita

Patent Number: 6,064,625
Date of Patent: May 16, 2000

[54] SEMICONDUCTOR MEMORY DEVICE HAVING A SHORT WRITE TIME

[75] Inventor: Hiroyoshi Tomita, Kawasaki, Japan

[73] Assignee: Fujitsu Limited, Kanagawa, Japan

[21] Appl. No.: 09/001,460

[22] Filed: Dec. 31, 1997

[30] Foreign Application Priority Data

Jun. 24, 1997 [JP] Japan ................................... 9-167451

[51] Int. Cl.[7] .................................................. G11C 8/00
[52] U.S. Cl. ...................... 365/233; 365/200; 365/230.03
[58] Field of Search .................... 365/233, 200, 365/230.03, 230.01, 189.01

[56] References Cited

U.S. PATENT DOCUMENTS

| | | | |
|---|---|---|---|
| 5,546,346 | 8/1996 | Agata et al. | 365/203 |
| 5,592,434 | 1/1997 | Iwamoto et al. | 365/233 |
| 5,802,596 | 9/1998 | Shinozaki | 711/169 |

*Primary Examiner*—David Nelms
*Assistant Examiner*—Hoai V. Ho
*Attorney, Agent, or Firm*—Arent Fox Kintner Plotkin & Kahn, PLLC

[57] ABSTRACT

The present invention internally latches a write data signal applied in synchronous with an external data strobe signal in response to an internal data strobe signal which is generated in response to this external data strobe signal, and furthermore, supplies the write data signal to a memory cell array from a write circuit such as a write amplifier in response to a write signal generated from this external data strobe signal. Meanwhile, an address signal is introduced internally in accordance with an external clock. Therefore, since the driving of the data bus connected to a memory cell array from a write amplifier, which constitutes a write operation internal to memory, commences in accordance with an external data strobe signal, a write operation can be ended in the shortest possible time from write data signal input. The above-described invention is especially effective when memory comprises a 2-bit pre-fetch. That is, a 2-bit write data signal is supplied time-sequentially in synchronous with an external data strobe signal. Since an internal write operation can commence after receiving for the input of that second write data signal, it enables the shortest write operation.

20 Claims, 25 Drawing Sheets

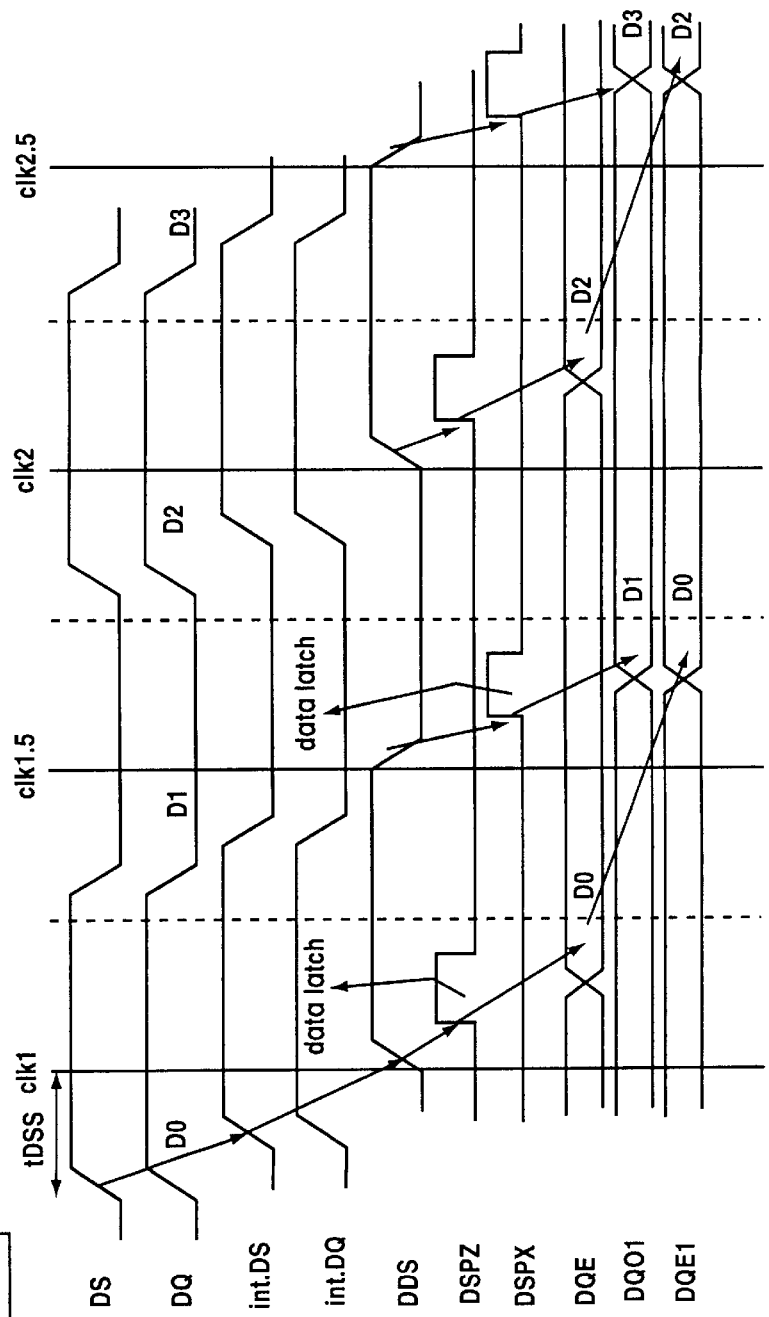

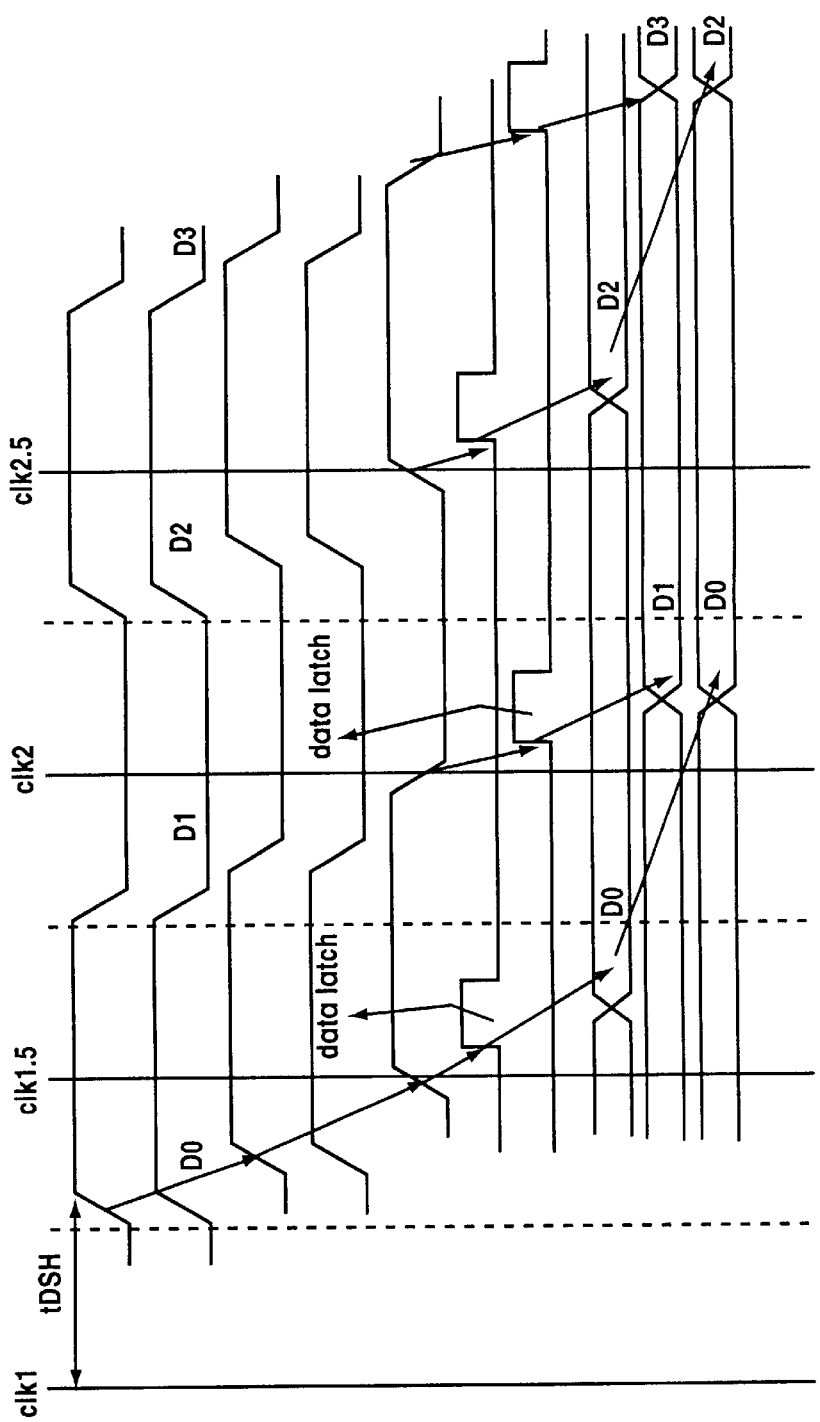

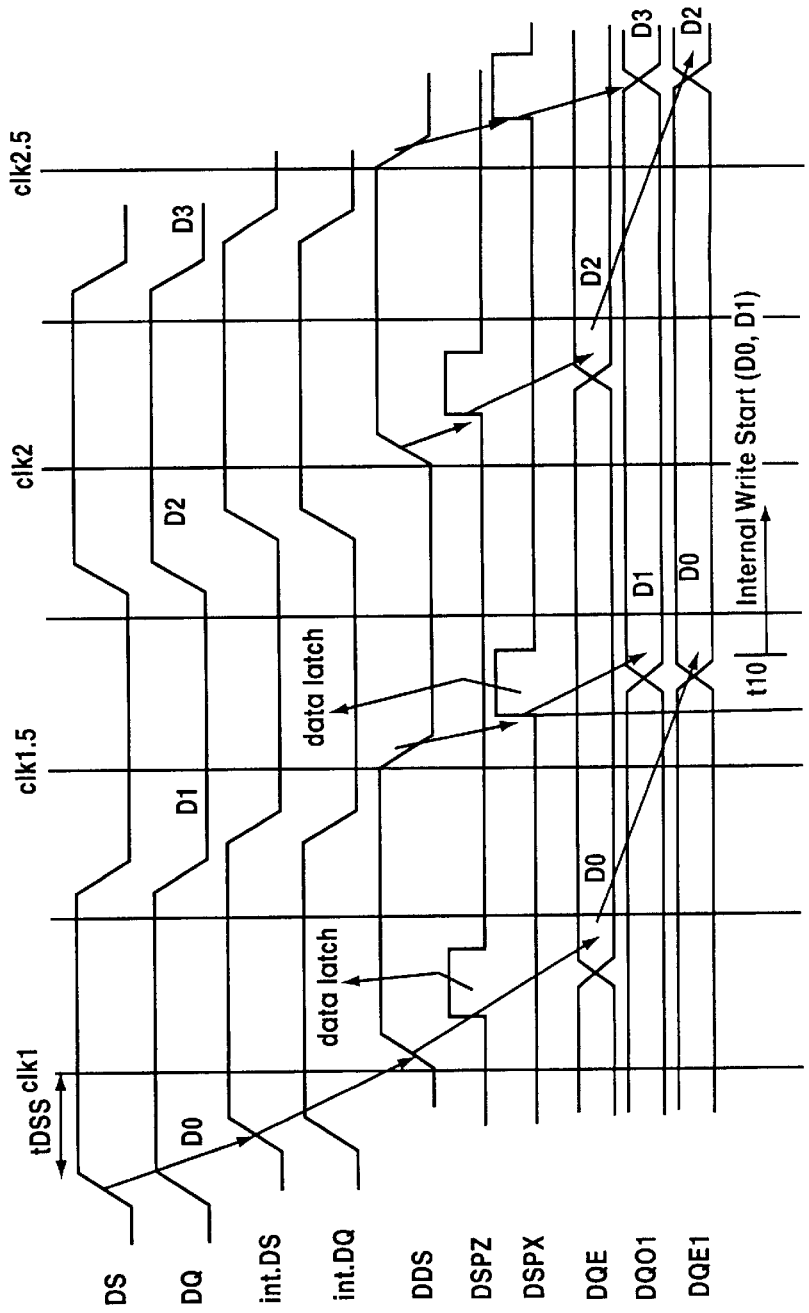

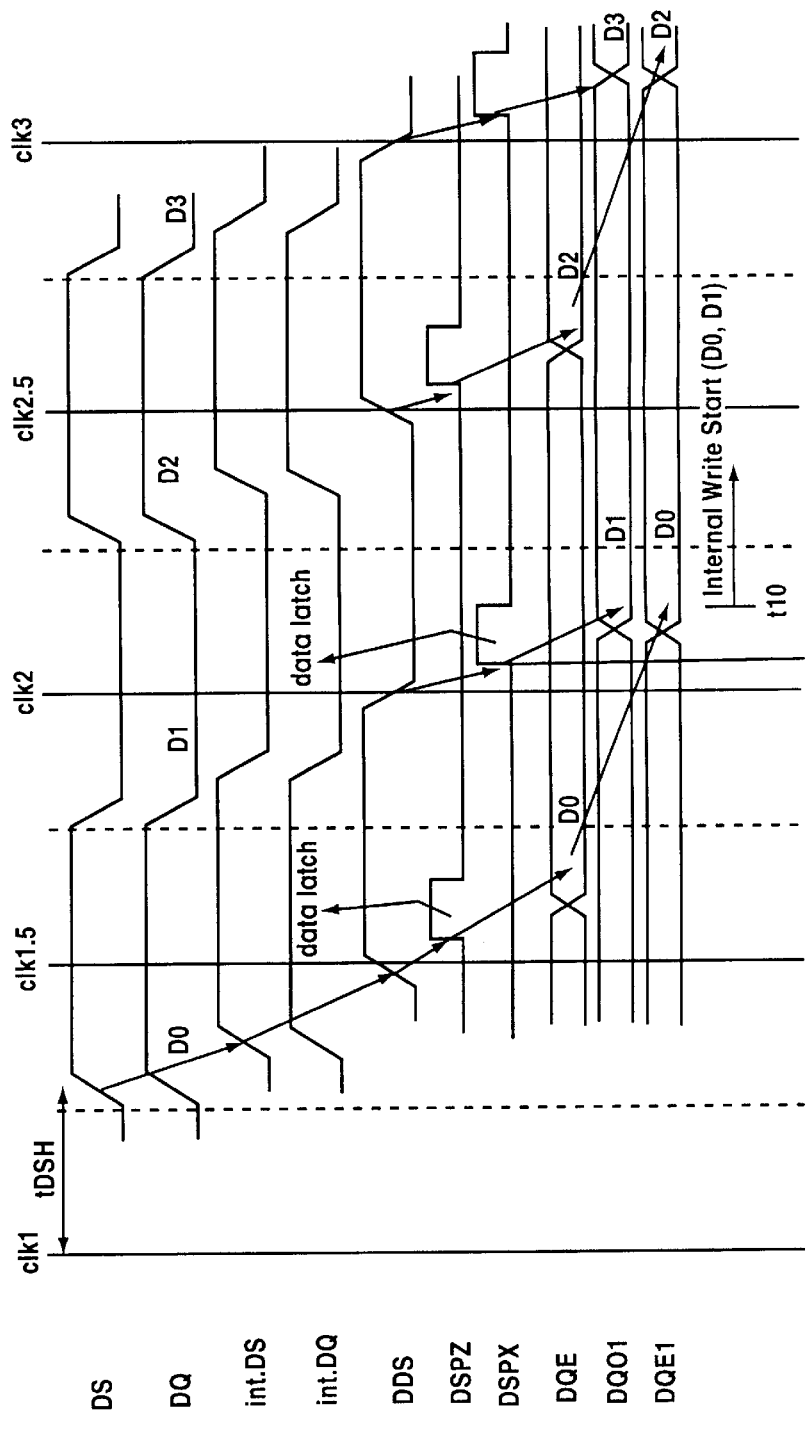

7 2. 7 4. 8 2. 8 4 Driver n1 : PCA××Z1, COMZ1
n2 : PCA××Z2, COMZ2
n3 : PCA××Z3, COMZ3

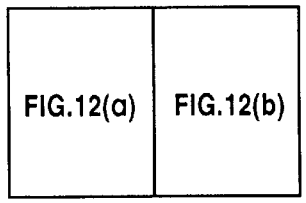
FIG.12
FIG.12(a)
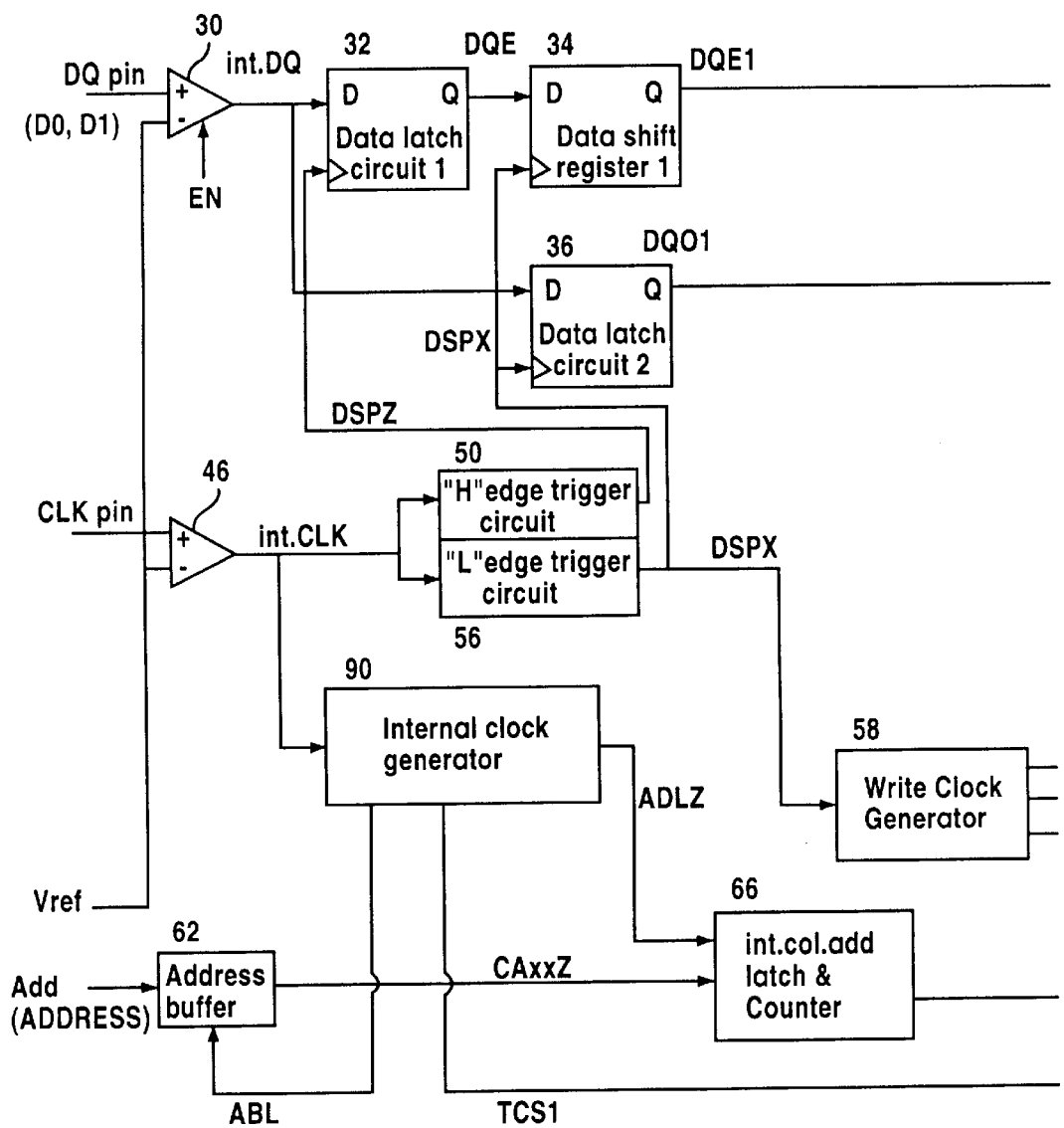

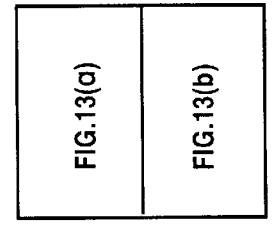
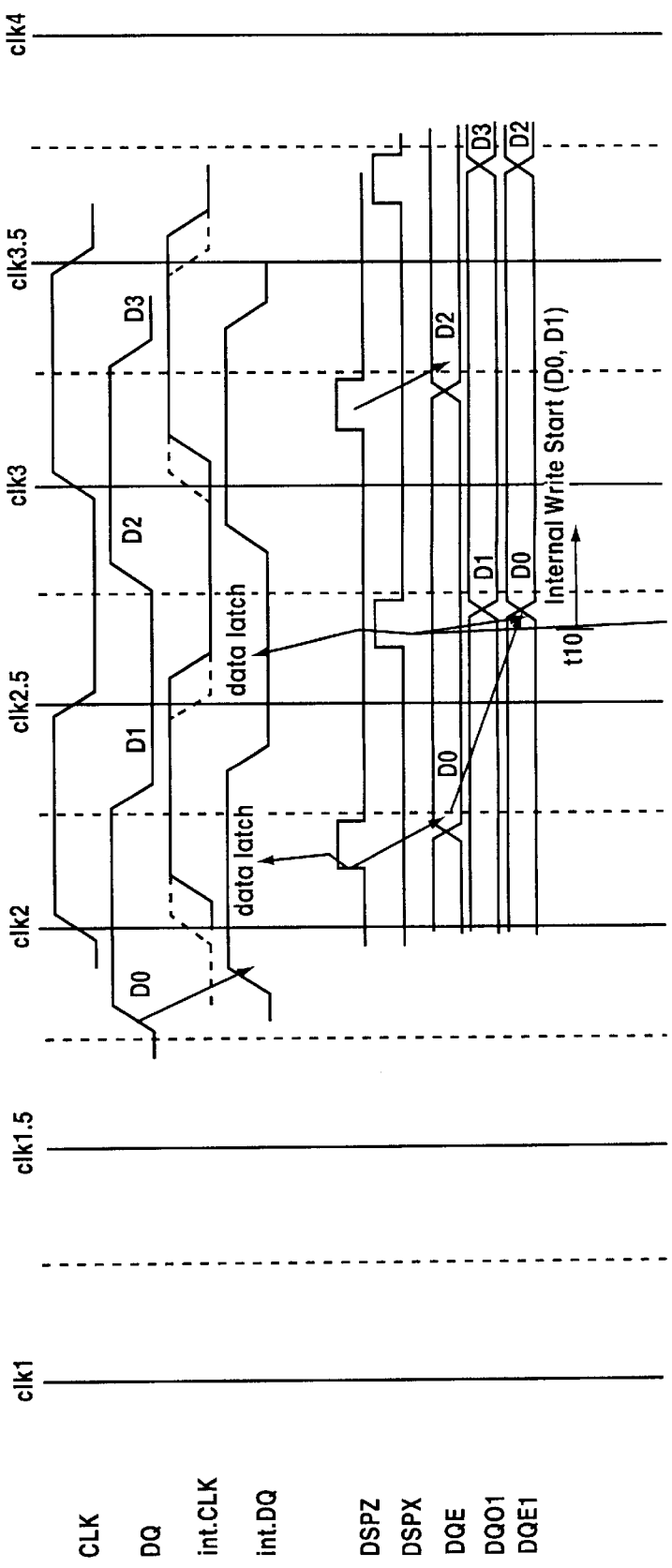
FIG.13(a)

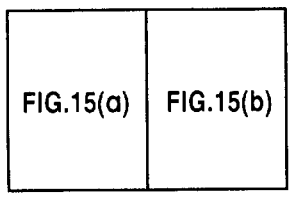
FIG.15
FIG.15(a)
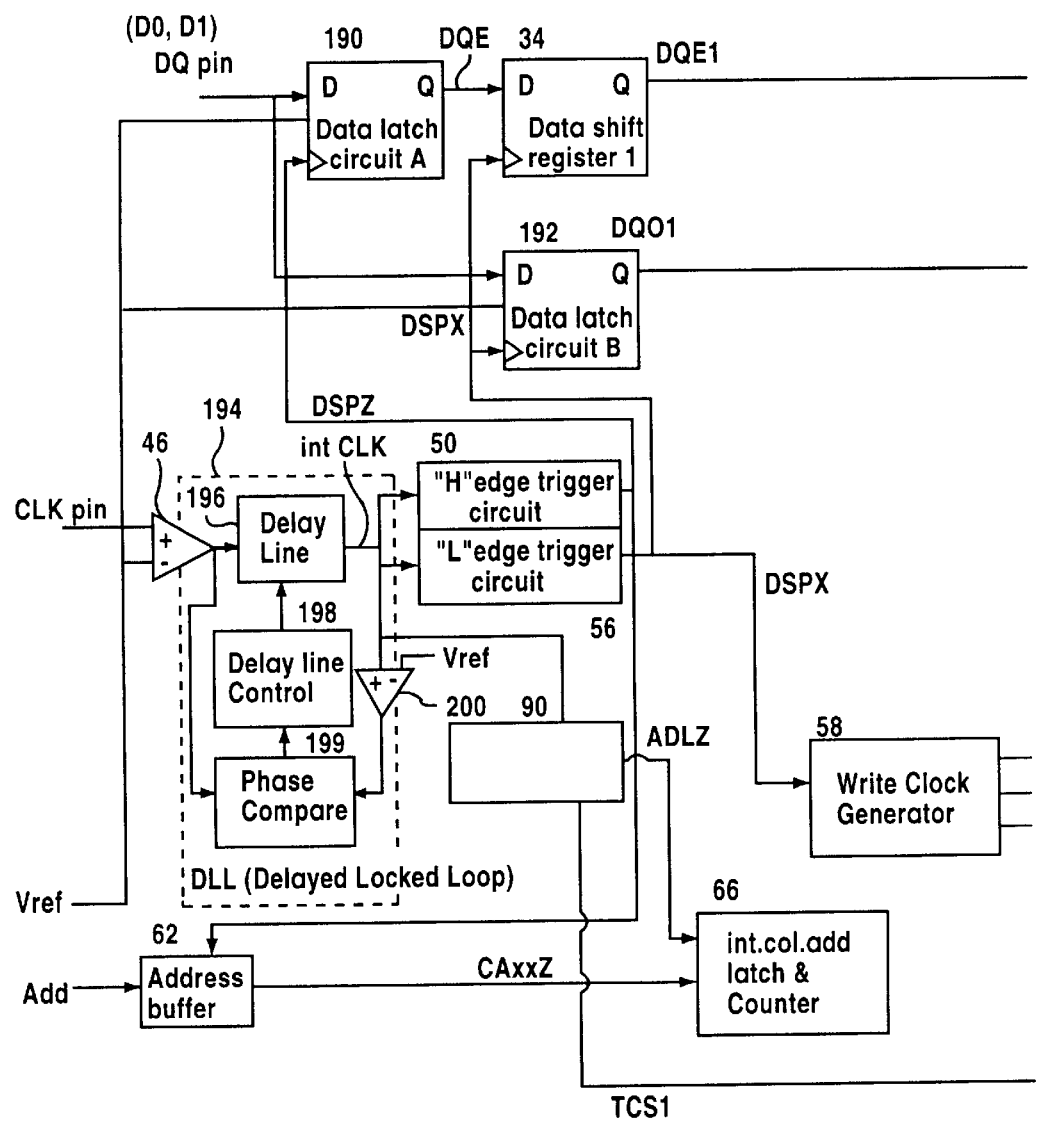

190, 192 Data Latch Circuit

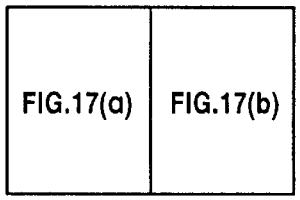
FIG.17
FIG.17(a)
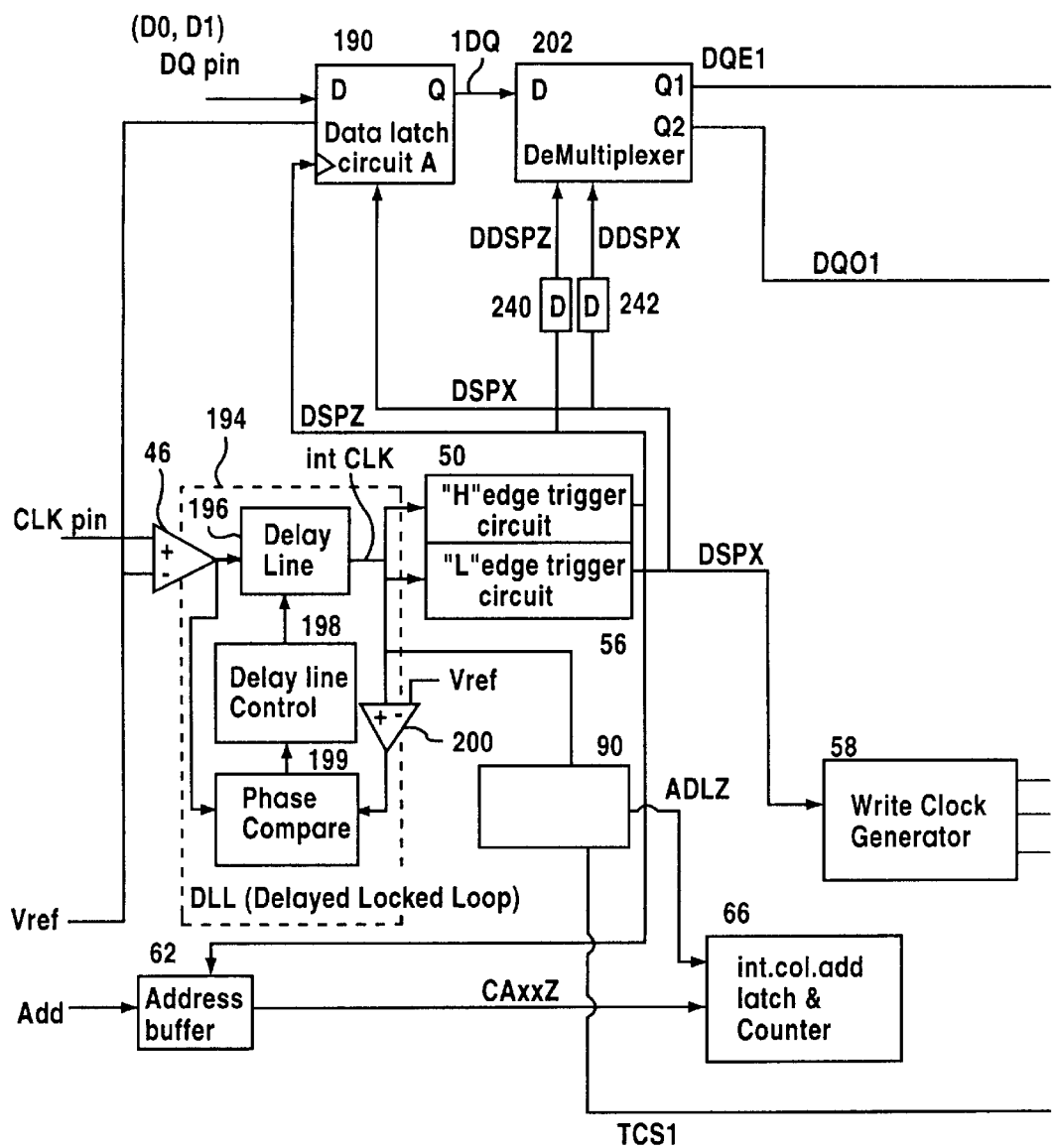
FIG.17(a)

SEMICONDUCTOR MEMORY DEVICE HAVING A SHORT WRITE TIME

BACKGROUND OF THE INVENTION

1. Field of the Invention

The present invention relates to a write operation of a synchronous dynamic random access memory (DRAM), comprising a 2-bit pre-fetch function, and more particularly, to a semiconductor memory device capable of shortening write time.

2. Description of the Related Art

A synchronous DRAM receives in synchronous with a clock an address and control command from a system that controls memory, and performs internal read and write operations in synchronous with the clock. As a result, it makes possible highspeed memory operations.

Furthermore, for an externally-supplied column address, synchronous DRAM comprises a burst mode function, which accesses the memory cell of that column address, and a column address subsequent thereto. In this burst mode, a synchronous DRAM can perform read or write operations by accessing the memory cells of sequential column addresses of 2-bits, 4-bits or 8-bits from the supplied column address according to the burst length.

To make this burst mode even more efficient, a 2-bit pre-fetch function is incorporated. A 2-bit pre-fetch function latches a supplied column address or an internally-generated first column address, generates a second column address by adding 1 bit to that first column address, and accesses a memory cell with a first and second column address. The memory cell array side comprises an odd memory cell array with a corresponding column address decoder and output data hold circuit, and an even memory cell array with a corresponding column address decoder and output data hold circuit. When the first column address is even, the first column address is applied to the even column address decoder, and the second column address is applied to the odd column address decoder, respectively. And when the first column address is odd, the first column address is applied to the odd column address decoder, and the second column address is applied to the even column address decoder, respectively. Then, data is sequentially output to the outside, either from even data to odd data, or from odd data to even data. Or, when writing, either even data and odd data are written in that order together with the even first column address, or odd data and even data are written in that order together with the odd first column address.

As described above, in a synchronous DRAM, a control signal and an address signal are generally applied from outside in synchronous with a clock, and internally, various operations are performed in synchronous with a clock.

However, for a write operation, external write data must be applied to a memory data input-output terminal (DQ terminal). This data input-output terminal differs from a command signal and address signal input terminal in that it has a large load carrying capacity. The reason for this is that command signal and address signal input terminals are dedicated input terminals, and as such, their internal circuitry is connected only to input circuits. By contrast, the load carrying capacity of a data input-output terminal is large because it is connected to both input circuitry and output circuitry.

Therefore, the system is capable of applying a command signal and address signal in synchronous with a clock relatively easily. However, when a write data signal is applied to a data input-output terminal with a large load carrying capacity, that data signal undergoes rounding, making it difficult to furnish memory with a data signal that is accurately in synchronous with the rising edge or falling edge of the clock. That is, a command signal and address signal can be accurately applied to a command signal and address signal input terminal that has a small input load capacity, by using a common clock as a strobe signal. However, from the standpoint of specifications, it is difficult to apply a write data signal to a data input-output terminal that has an input load capacity larger than the above input terminal by using the same clock as a strobe signal. Moreover, it is even more difficult to apply a write data signal at high speed in synchronous with the rising edge and falling edge of a clock.

Thus, it was proposed that the system supply a write data signal in synchronous with a data strobe signal that is not in synchronous with the clock. This data strobe signal has the same frequency as the clock, but is not phase synchronousronized with the clock.

It is thus necessary to solve the problem of how to control an internal write operation in line with the introduction of a data strobe signal that is not in synchronous with the clock. A proposal has yet to be made for using an externally-applied clock and data strobe signal to perform an optimum write operation.

Thus, to solve the problems of the past described above, an object of the present invention is to provide a semiconductor memory device capable of performing an optimum write operation using a clock and a data strobe signal that is asynchronous thereto.

Further, a separate object of the present invention is to provide a semiconductor memory device capable of performing the shortest write operation using a clock and a data strobe signal that is asynchronous thereto.

Further, it is a separate object of the present invention to provide a semiconductor memory device capable of shortening a write operation in a memory, to which command, address, and write data signals are supplied in synchronous with a clock.

SUMMARY OF THE INVENTION

To achieve the above-described objects, the present invention is a semiconductor memory device, which receives at least an address signal in synchronous with an externally-supplied external clock, comprises:

a memory cell array, comprising a plurality of memory cells that store data;

a data signal input circuit for holding a write data signal supplied in synchronous with an externally-supplied external data strobe signal response to an internal data strobe signal which is generated in response to said external data strobe signal; and a write circuit for, in response to a write signal generated later than said internal data strobe signal in response to said external data strobe signal, supplying to said memory cell array a write data signal held by said data signal input circuit.

The above-described invention internally latches a write data signal applied in synchronous with an external data strobe signal in response to an internal data strobe signal which is generated in response to this external data strobe signal, and furthermore, supplies the write data signal to a memory cell array from a write circuit such as a write amplifier in response to a write signal generated from this external data strobe signal. Meanwhile, an address signal is introduced internally in accordance with an external clock. Therefore, since the driving of the data bus connected to a memory cell array from a write amplifier, which constitutes a write operation internal to memory, commences in accordance with an external data strobe signal, a write operation can be ended in the shortest possible time from write data signal input.

The above-described invention is especially effective when memory comprises a 2-bit pre-fetch. That is, a 2-bit write data signal is supplied time-sequentially in synchronous with an external data strobe signal. Since an internal write operation can commence after receiving for the input of that second write data signal, it enables the shortest write operation.

In addition, as an internal write operation, a column address signal and a redundancy comparison result signal are applied to a column decoder corresponding to a memory cell array in response to a column select signal generated in response to a external data strobe signal.

In addition to the above described invention, a write operation can be further speeded up by carrying out, in response to an address latch signal generated in response to an external clock, a comparison operation in a redundancy comparator relative to an address signal applied in synchronous with that external clock. When there is a 2-bit pre-fetch function in particular, since one clock cycle is required to introduce a 2-bit write data signal, by carrying out in a redundancy comparator a comparison operation with a redundant address during that time, preparations for supplying a redundancy comparison result signal to a column decoder will already be complete by the time the write data signal is introduced.

A separate invention for achieving the object described above is a semiconductor memory device, which receives at least a command signal and an address signal in synchronous with an externally-supplied external clock, said command signal and address signal being supplied in synchronous with a first clock of said external clock, comprises:

a memory cell array, comprising a plurality of memory cells that store data;

a redundancy comparator for comparing a defective address corresponding to a defective memory cell of said memory cell array to supplied address;

a data input circuit for, in responsive to an internal data strobe signal generated in response to a second clock supplied after said first clock of said external clock, holding an externally-supplied write data signal;

a write circuit for, in response to a write signal generated later than said internal data strobe signal in response to said second clock, supplying to said memory cell array said write data signal held by said data input circuit; and an address latch circuit for, in response to an address latch signal generated in response to said first clock, supplying said address signal to said redundancy comparator.

With the above-described invention, in memory, where command, address and write data signals are supplied in synchronous with an external clock, when a command and an address are applied in synchronous with a first clock, and a write data signal is applied in synchronous with a second clock subsequent to the first clock, a redundancy comparison operation is performed in a redundancy comparator in synchronous with the first clock. This enables the leading redundancy comparison operation to be performed by the time the input operation for the write data signal applied in synchronous with the second clock is complete, thereby making it possible to shorten the write operation.

BRIEF DESCRIPTION OF THE DRAWINGS

FIG. 14 depicts the detailed circuitry of an input buffer connected to a data input-output terminal DQ;

DESCRIPTION OF THE PREFERRED EMBODIMENTS

The following is an explanation of the preferred embodiments of the present invention in accordance with the figures. However, the technological scope of the present invention is not restricted to such embodiments.

Figure 1:
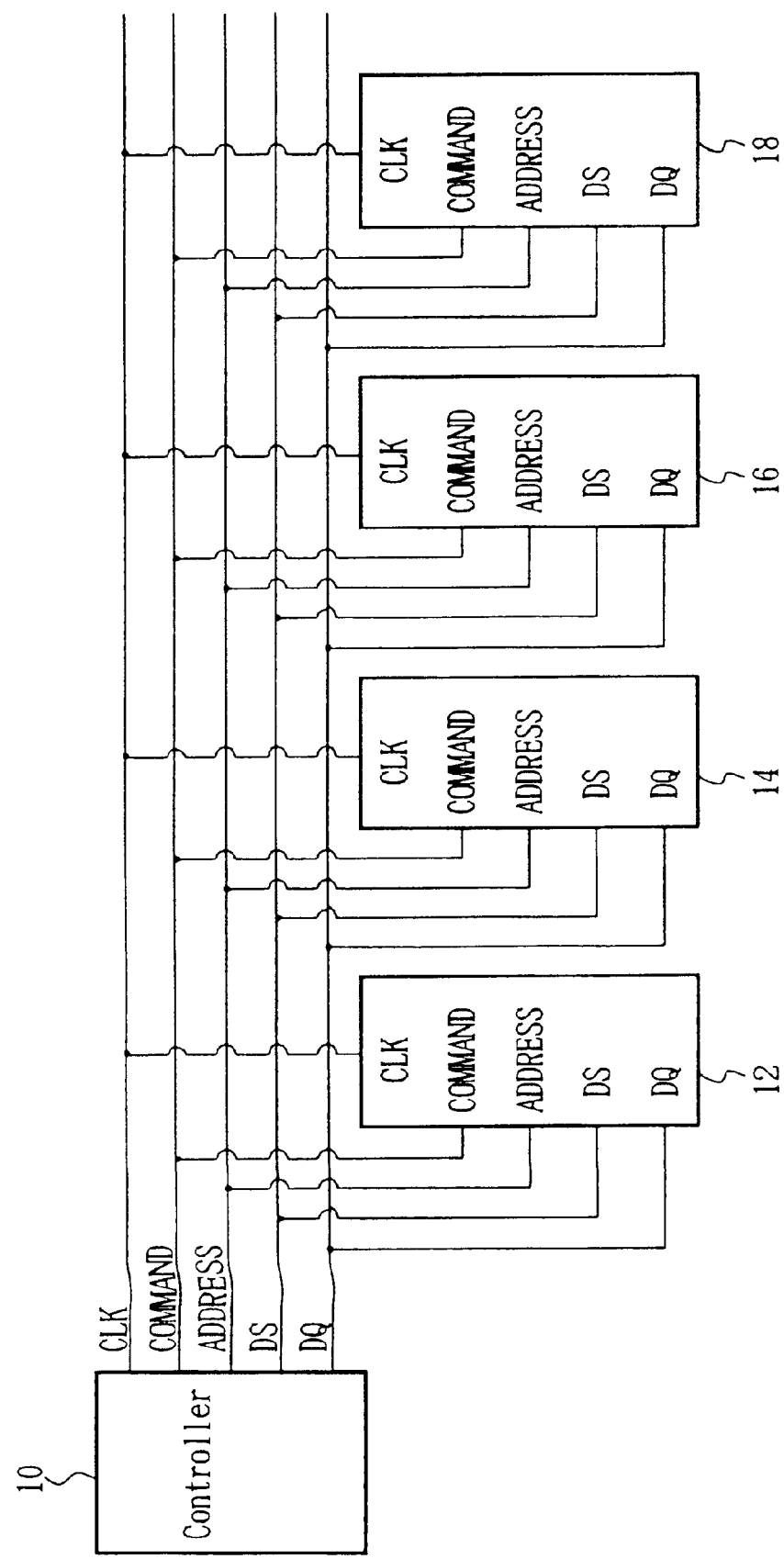
FIG. 1 depicts a schematic diagram of the relationship between a plurality of memories and a controller, which controls them.

FIG. 1 is a schematic diagram depicting the relationship between a plurality of memories and the controller, which controls them. In this example, four SDRAM 12, 14, 16, 18 are connected to a system controller 10. In this example, a command signal COMMAND and an address signal ADDRESS are applied in synchronous with a clock CLK. Also, a write data signal is applied in synchronous with a data strobe signal DS to a data input-output terminal DQ. By doing this, the strobe signal DS for the large load capacity data input-output terminal DQ can be made asynchronous to the clock CLK, which is the strobe signal for the command signal and address signal, enabling write data to be more accurately applied to the memories 12–18.

Figure 2:
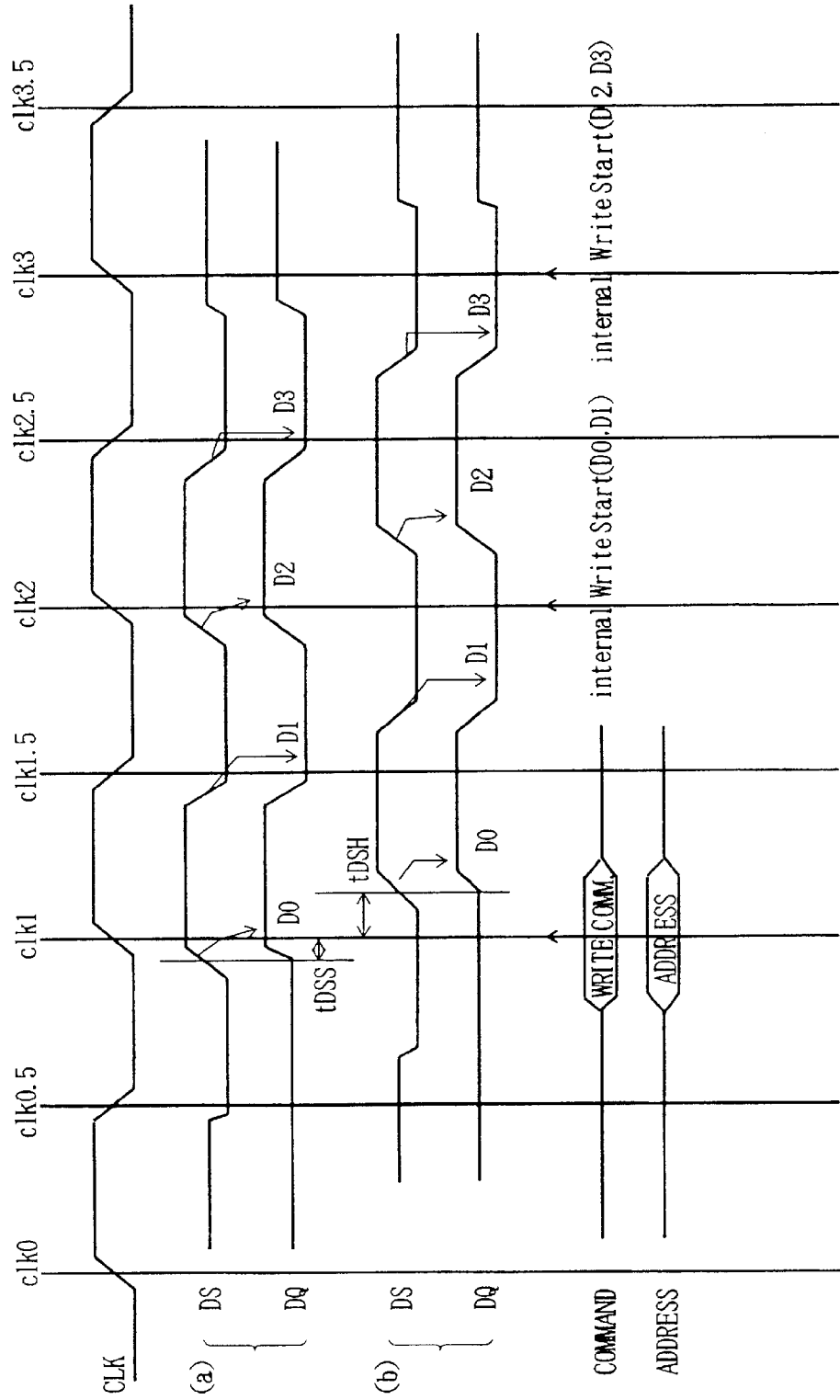
FIG. 2 depicts a simplified timing chart of a write operation which uses a clock CLK and a data strobe signal DS asynchronousronous thereto.

FIG. 2 depicts a simplified timing chart of a write operation, which uses the above-described clock CLK and data strobe signal DS asynchronous thereto. In this example, a write command is applied in the command signal COMMAND in synchronous with the clock clk1, and a column address is applied in the address signal ADDRESS in synchronous with the clock clk1, respectively. By contrast, write data D0, D1, D2, D3 are applied to the data input-output terminal DQ in synchronous with the rising and falling edges of the data strobe signal DS.

The data strobe signal DS is asynchronous with the clock CLK, but standards determine that it have the same frequency, and that it be within tDSS if phase is advanced, and within tDSH if phase is delayed. Thus, the (a) in the figure indicates the relationship between the write data in the data input-output terminal DQ and the data strobe signal DS when the phase of the data strobe signal DS leads by a maximum tDSS. And (b) in the figure indicates the relationship between write date in the data input-output terminal DQ and the data strobe signal DS when the phase of the data strobe signal DS lags by a maximum tDSH.

In the case of (a) in the figure, write data D0 applied to the data input-output terminal DQ is introduced at a timing which is a predetermined amount of time from the rising edge of the data strobe signal DS, and write data D1 applied to the data input-output terminal DQ is introduced at a timing which is a predetermined amount of time from the subsequent falling edge of the data strobe signal DS. Similarly, write date D2, D3 are also introduced in synchronous with the data strobe signal DS. Therefore, at clock clk1.5 timing, the introduction of 2-bits of write data D0, D1 has already been completed, and address input is also complete. Therefore, it is understood that an internal write operation can start at any time.

As an example, the figure indicates the start of an internal write operation at clock clk2 timing.

Conversely, in the case of (b) in FIG. 2, the data strobe signal DS rises at a timing which is delayed time tDSH from clock clk1 timing. Then, similar to the case of (a) described above, write data D0 applied to the data input-output terminal DQ is introduced at a timing which is a predetermined amount of time from the rising edge of the data strobe signal DS, and write data D1 applied to the data input-output terminal DQ is introduced at a timing which is a predetermined amount of time from the subsequent falling edge of the data strobe signal DS. Therefore, in this case, the input of both data D0, D1 is completed at a slightly faster timing than the clock clk2.

Figure 3:
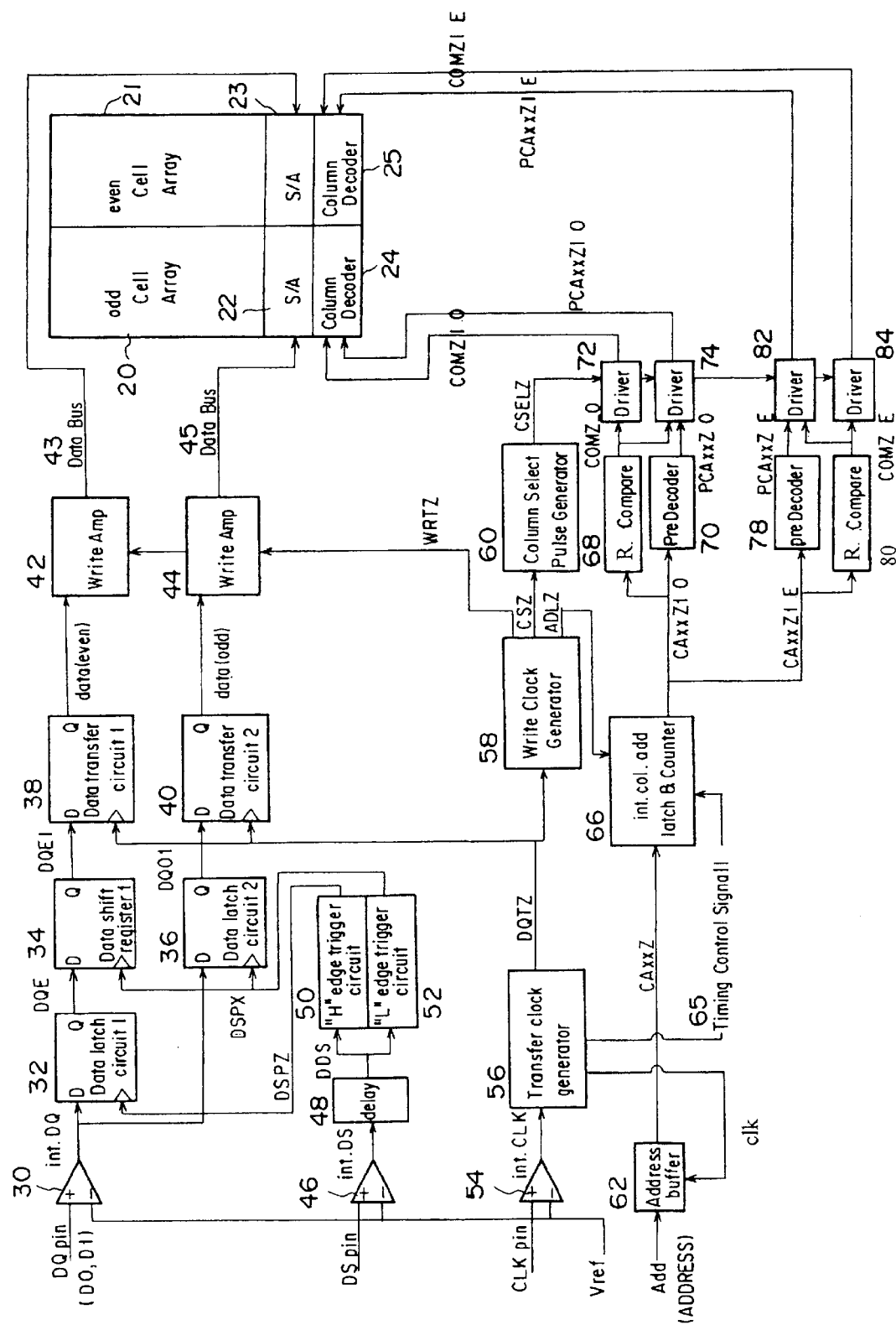
FIG. 3 depicts a simplified block diagram of a memory wherein an internal write operation is performed in synchronous with a clock CLK.

FIG. 3 depicts a schematic block diagram of memory when an internal write operation is performed in synchronous with the clock CLK. In this example, a memory cell domain comprises an odd memory cell array 20 and an even memory cell array 21. Then, both memory cell arrays 20, 21 are equipped with an odd sense amplifier 22 and an even sense amplifier 23, and an odd column decoder 24 and an even column decoder 25, respectively.

Of the peripheral circuits for these memory cell arrays, FIG. 3 depicts the write data input circuitry and the column address signal processing circuitry.

Figure 4B:
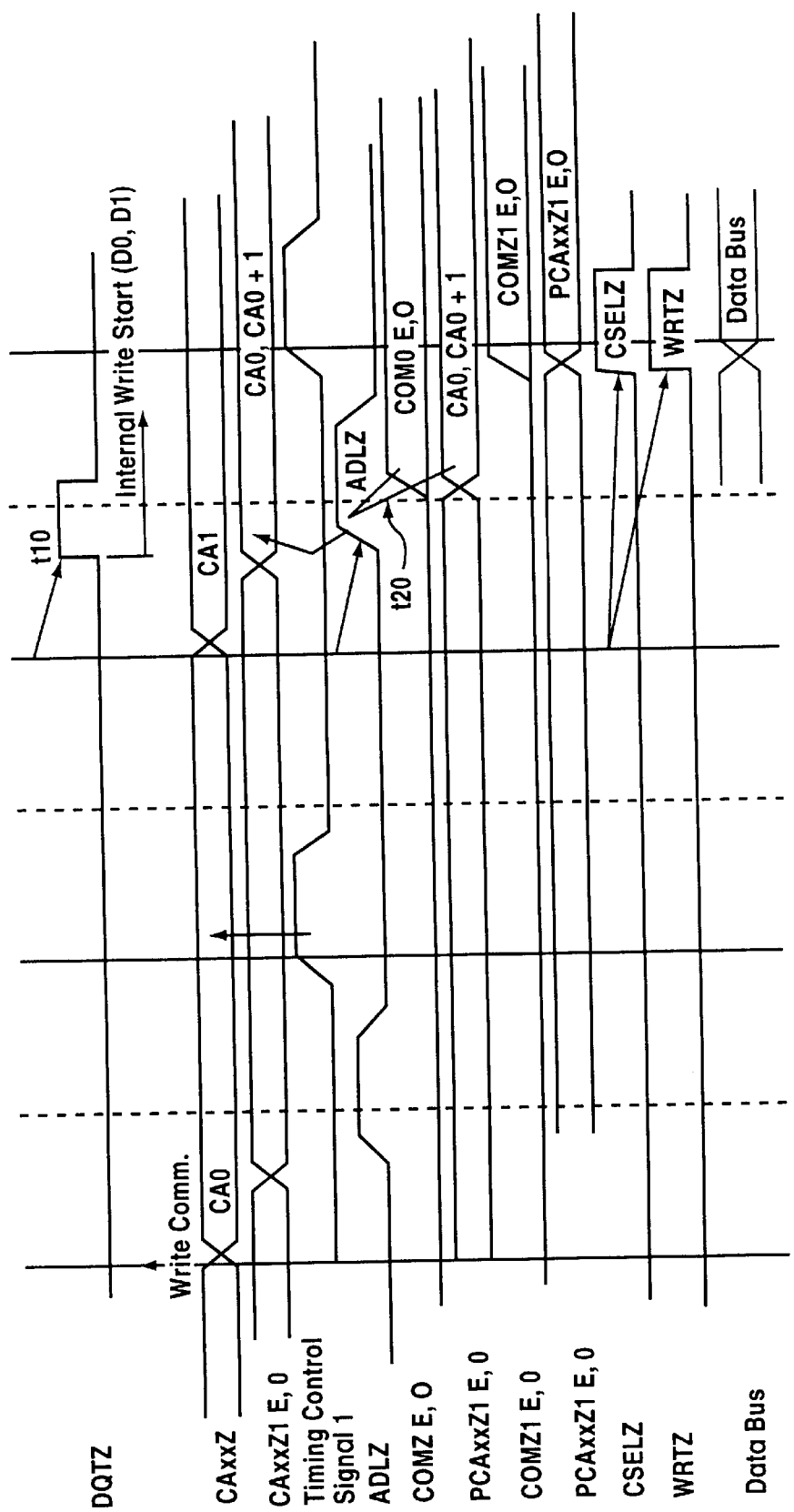
FIG. 4 depicts a timing chart showing the phase of a data strobe signal leading a reference clock by tDSS.
Figure 5B:
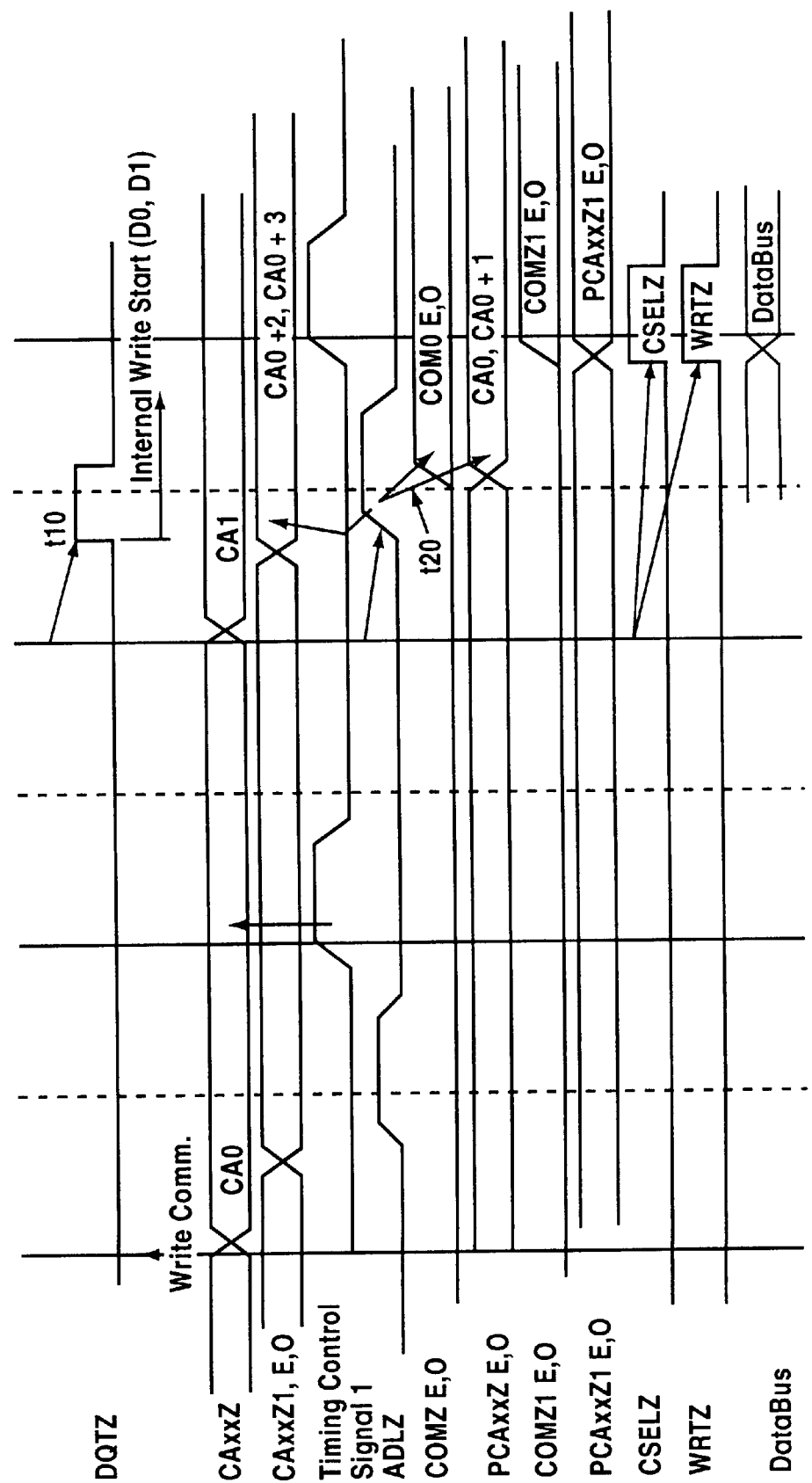
FIG. 5 depicts a timing chart showing the phase of a data strobe signal lagging a reference clock by tDSH.

FIG. 4 depicts a timing chart showing the phase of a data strobe signal DS leading the reference clock by tDSS. And FIG. 5 depicts a timing chart showing the phase of a data strobe signal DS lagging the reference clock by tDSH.

First, an explanation of the write data input circuitry depicted in FIG. 3 is given. An input buffer 30 is connected to the data input-output terminal DQ, and supplied write data signals D0, D1 are input using an externally-applied reference level Vref. The introduction of these write data signals, as described above, is performed at the rising edge or falling edge of the data strobe signal DS. Consequently, an externally-supplied data strobe signal DS is input via a buffer 46, and that inputted internal data strobe signal int. DS is delayed a fixed period of time in a delay circuit 48, becoming a delayed data strobe signal DDS. Then, this delayed data strobe signal DDS is supplied to a rising edge (H edge) trigger circuit 50, and the rising edge trigger circuit 50 generates a first data strobe signal DSPZ, which introduces the initial write data signal DQ. As a result, write data signal D0 (internal write data signal int. DQ in the figure) is introduced into a first data latch circuit 32 at first data strobe signal DSPZ timing.

Furthermore, a second data strobe signal DSPX in synchronous with the falling edge of the data strobe signal DS is generated by a falling edge (L edge) trigger circuit 52, and the inputted second write data signal D1 is introduced into a second data latch circuit 36 at this second data strobe signal DSPX timing. At this same time, the initial write data signal D1 in the data latch circuit 32 is latched by a data shift register 34. Up to this point, the write data signals D0, D1 have been introduced internally in synchronous with a data strobe signal DS.

A first and second write data DQE1 and DQE2 latched to a data shift register 34 and data latch circuit 36, respectively, are latched to respective data transfer circuits 38, 40 based on the timing of a clock-synchronized data transfer signal DQTZ generated by a transfer clock generator 56. A clock CLK (an internal clock int. CLK in the figure) inputted by a buffer 54 is applied to the transfer clock generator 56. Therefore, the data transfer signal DQTZ is generated at a timing a predetermined time after clock clk2 timing, at which the introduction of the two write data D0, D1 completes accurately. As a result, the write data signals that were synchronized to the data strobe signal DS become signals synchronized to the clock CLK by data transfer circuits 38, 40. Also, in this example, the initial write data D0 is an example of even write data, and the second write data is an example of odd write data.

Then, at a write signal WRTZ timing generated by a write clock generator 58, an even write amplifier 42 and an odd write amplifier 44 are activated, and write data signals are output to respective data buses 43, 45.

Conversely, the column address processing part is as described below. A column address signal supplied to a column address terminal ADDRESS is introduced internally by an address buffer 62 at a timing in synchronous with the rising edge of a clock clk1. Then, the internally-introduced column address signal CAxxZ (where xx signifies the address number) is input to an internal column address latch & counter circuit 66 based on timing control signal 65 timing generated by a transfer clock generator 56 at a timing delayed a predetermined time from clock clk1 timing.

This internal column address latch & counter circuit 66 latches the applied column address and generates a sequential column address using a counter function to increment the latched column address by +1. Then, when the initial column address is even, that column address is applied to an even predecoder, and the +1 incremented second column address is applied to an odd predecoder.

Then, similar to the write signal WRTZ, a write clock generator 58 generates an address generation signal ADLZ at a timing delayed a predetermined time from clock clk2 timing. As a result, the internal column address latch & counter circuit 66, in response to the address generation signal ADLZ, furnishes an odd column address CAxxZ1O and an even column address CAxxZ1E to respective redundancy comparators 68, 80 and predecoders 70, 87. The respective circuits generate comparison result signals COMZO, COMZE and predecoded signals PCAxxZO, PCAxxZE.

A column select pulse generator 60 responsive to a timing signal CSZ generated by a write clock generator 58 generates a column select signal CSELZ, and drives drivers 72, 74, 82, 84 so as to apply the respective comparison result signals COMZ1O, COMZ1E and predecoded signals PCAxxZ1O, PCAxxZ1E to column decoders 24, 25 at substantially the same timing as the write signal WRTZ. That is, a write signal WRT and column select signal CSELZ are generated in synchronous with clock clk2 timing, and the timing of the output of write data to data buses 43, 45 is aligned with the timing of the output of a predecoded signal and a redundancy comparison result signal in accordance with the column address to column decoders 24, 25.

Therefore, in the memory depicted in FIG.'s 3 through 5, a write data signal is introduced in synchronous with a data strobe signal DS, and an internal write operation is controlled on the basis of a data transfer signal DQTZ generated in response to clock clk2 timing.

However, as can be understood from the above explanation, one clock CLK cycle is required to introduce a first and second write data signal. This is because the first and second write data signals are introduced on the rising edge and falling edge of a data strobe signal DS. For this reason, it is probably appropriate to commence an internal write operation at a clock clk2 timing one cycle after the clock clk1.

However, as shown in FIG. 4, when a data strobe signal is input at a fast timing, the introduction of write data D0, D1 is already complete at a timing halfway between clocks clk1.5 and clk2 in the figure. Furthermore, a column address is also applied in synchronous with the clock clk1. In this case, waiting until clock clk2 timing is the cause of longer write time.

Furthermore, the start of column address generation, comparison with a redundant address, and predecoding in response to an address generation signal ADLZ delay the timing of the generation of a column select signal CSELZ happened after the generation of a redundancy comparison result signal and predecoded signal.

Figure 6:
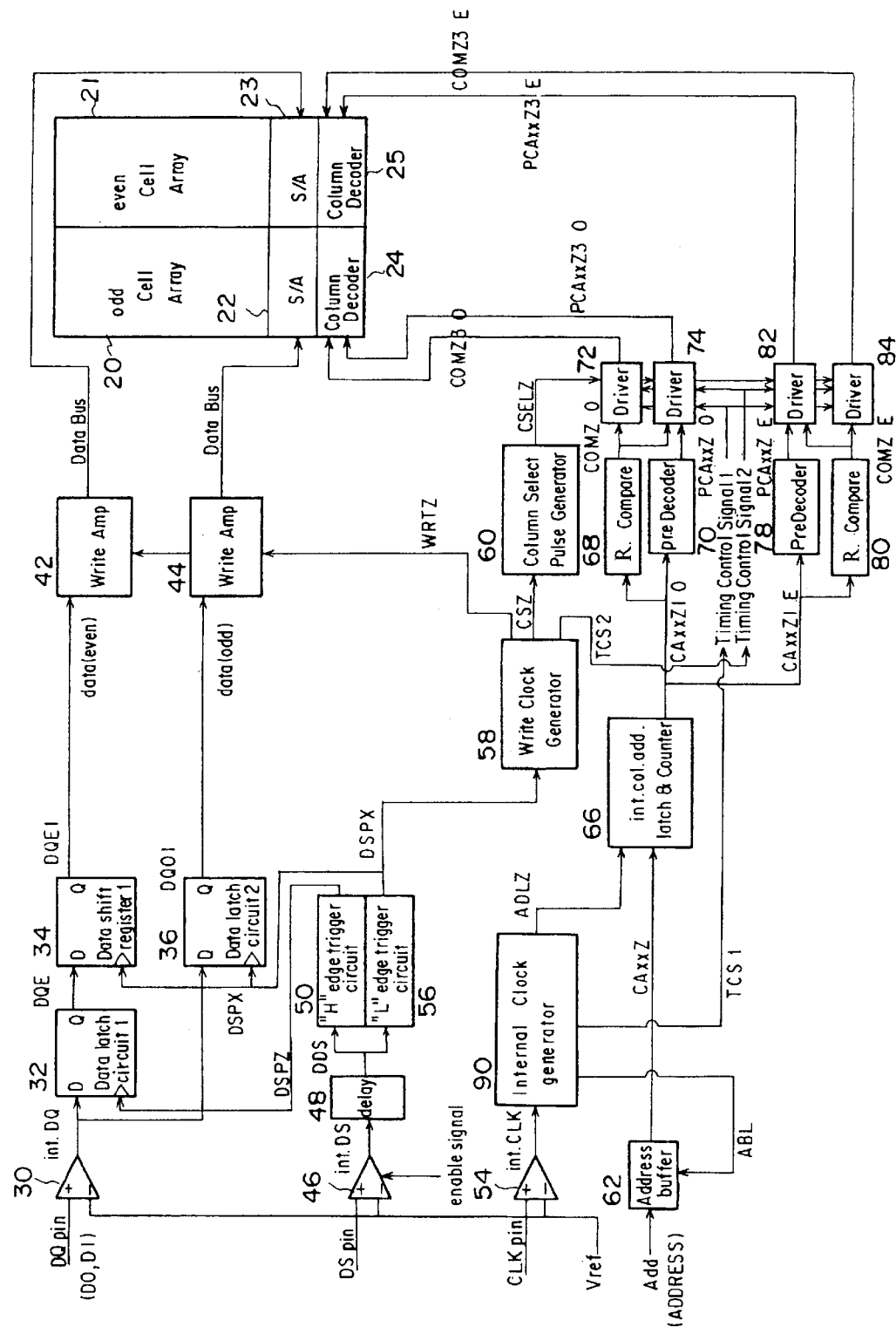
FIG. 6 depicts a simplified block diagram of a memory, wherein an internal write operation is performed in synchronous with a data strobe signal.
Figure 7B:
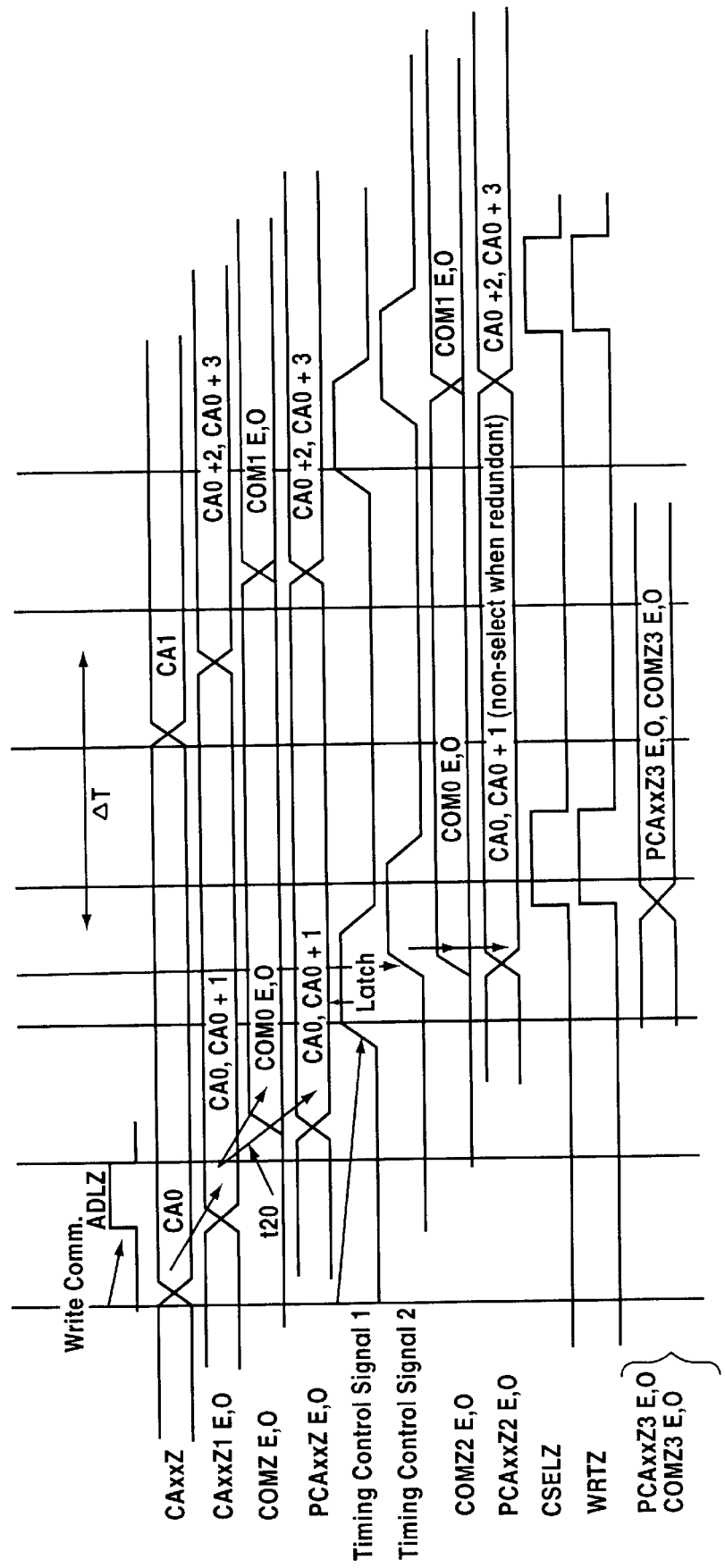
FIG. 7 depicts a timing chart showing the phase of the data strobe signal DS in FIG. 6 leading a reference clock by tDSS.
Figure 8B:
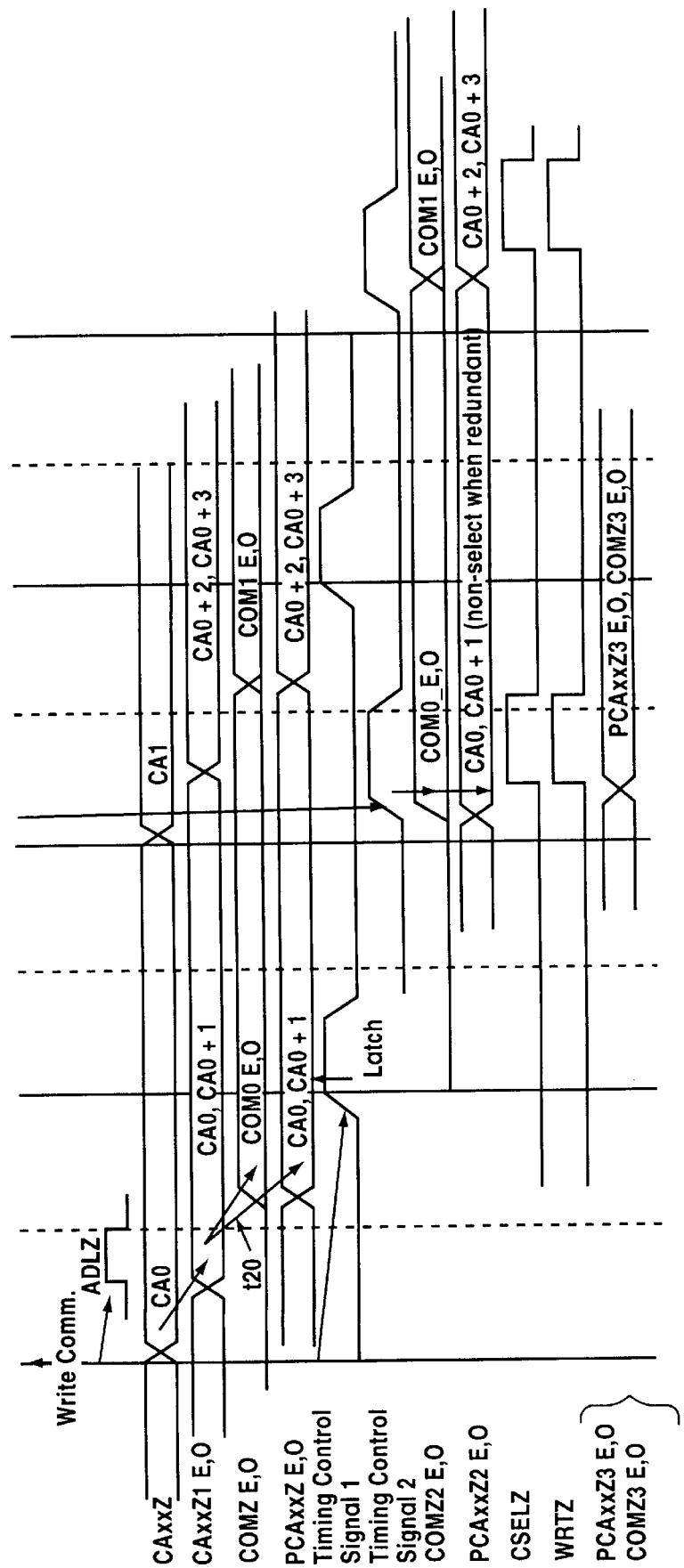
FIG. 8 depicts a timing chart showing the phase of the data strobe signal DS in FIG. 6 lagging a reference clock by tDSH.

FIG. 6 depicts a simplified block diagram of a memory, wherein an internal write operation is performed in synchronous with a data strobe signal, which is an embodiment related to the present invention. FIG. 7 depicts a timing chart showing the phase of the data strobe signal DS depicted in FIG. 6 leading the reference clock by tDSS. And FIG. 8 depicts a timing chart showing the phase of the data strobe signal DS depicted in FIG. 6 lagging the reference clock by tDSH.

The memory depicted in FIG. 6, like the configuration of the memory depicted in FIG. 3, comprises write data input circuitry in the upper left portion of the diagram, and column address processing circuitry in the lower left portion of the diagram. The memory cell array part in the right side of the diagram is configured the same as that shown in FIG. 3. Therefore, the same reference numbers are attached to the parts that correspond to those depicted in FIG. 3.

In the example of memory depicted in FIG. 6, a write data signal DQ (D0, D1) is introduced internally in synchronous with a data strobe signal DS, and internal write timing is also controlled on the basis of the data strobe signal DS. More specifically, write data signals D0, D1 are introduced from a data input-output terminal DQ by a first data strobe signal DSPZ and a second data strobe signal DSPX. In addition, on the basis of the second data strobe signal DSPX, a write signal WRTZ, which activates write amplifiers 42, 44, is generated by a write clock generator 58, and a column select signal CSELZ is generated by a column select pulse generator 60.

Furthermore, in the example of a memory depicted in FIG. 6, a column address signal ADDRESS is introduced internally at a clock CLK synchronized timing, and the generation of a +1 incremented address, as well as operations in redundancy comparators 68, 78 and predecoders 70, 80 are controlled synchronous with the clock CLK.

Therefore, by way of an overview, a column address is introduced, and counter, predecode and redundancy comparison operations are performed on the basis of clock clk1 timing. Meanwhile, a write data signal is introduced on the rising edge and falling edge of a data strobe signal DS, and an internal write operation is carried out based on a timing that has the falling edge of the data strobe signal as its starting point. An internal write operation outputs write data to a data bus by activating write amplifiers 42, 44, and supplies a redundancy comparison result signal COMZ3 and predecoded signal PCAxxZ3 to column decoders 24, 25 of memory cell arrays in response to a column select signal CSELZ.

To perform the above-described operations, the memory depicted in FIG. 6 differs from that depicted in FIG. 3 in that a write clock generator 58 generates a write signal WRT in response to a second data strobe signal DSPX generated from the data strobe signal. Also, a column select pulse generator 60 generates a column select signal CSELZ in respect to a signal CSZ generated by the write clock generator 58. This also differs from the operation of the memory depicted in FIG. 3. Therefore, the data transfer circuits 38, 40 depicted in FIG. 3 do not exist in the example depicted in FIG. 6.

Furthermore, in the memory depicted in FIG. 6, comparing to that depicted in FIG. 3, the redundancy comparators 68, 80 and predecoders 70, 78 are controlled in advance, separate from the internal write operation, at a timing of clk1 of the clock CLK. For this reason, the timing of a column address CAxxZ1 output by an internal column address latch & counter 66 is controlled by an address generation signal ADLZ generated by an internal clock generator 90.

The configuration and operations of the memory depicted in FIG. 6 are explained below with reference to FIG. 7. FIG. 7 depicts a timing chart indicating a data strobe signal DS with a phase that is faster than the reference clock by tDDS. An initial write data D0 input from a data input-output terminal DQ is latched into a first data latch circuit 32 by a first data strobe signal DSPZ generated at the timing of a rising edge of a delayed data strobe signal DDS generated from the data strobe signal DS. Furthermore, a second write data D1 is latched into a second data latch circuit 36 by a second data strobe signal DSPX generated at the timing of a falling edge of a subsequent delayed data strobe signal DDS. Then, the write data D0 simultaneously latched into the first data latch circuit 32 is held in a data shift register 34 based on second data strobe signal DSPX timing.

Following the second data strobe signal DSPX timing described above, since latching has been completed for two write data signals D0, D1, the write clock generator 58 generates a write signal WRTZ in response to that signal DSPX. Also, based on a signal CSZ generated by the write clock generator 58, a column select pulse generator 60 generates a column select signal CSELZ.

In the meantime, an address buffer 62 introduces a column address ADDRESS in response to an address buffer latch signal ABL generated by an internal clock generator 90 based on clock clk1 timing, and generates an internal column address CAxxZ. The xx here denotes the existence of a plurality of column addresses.

In addition, an internal column address latch & counter 66 generates from the applied internal column address CAxxZ a subsequent column address which has been incremented by +1 by the counter. For example, it generates an even column address CAxxZ1E and an odd column address CAxxZ1O. This even column address CAxxZ1E and odd column address CAxxZ1O are respectively applied to an even redundancy comparator 80 and predecoder 78 and an odd redundancy comparator 68 and predecoder 70 based on address generation signal ADLZ timing. Then, the address generation signal ADLZ is generated by an internal clock generator 90 on the basis of a clock clk1.

Therefore, the generation of an incremented address, the comparison with a redundant address, and the predecoding operation for a column address signal ADDRESS are performed rapidly at a timing based on the clock clk1 with no relation to a data strobe signal DS. Therefore, the timing of the outputs of comparison result signals COMZO, COMZE and predecoded signals PCAxxZO, PCAxxZE by drivers 72, 74, 76, 78 can be made faster than the timing used in the memory depicted in FIG. 3. This timing is the column elect signal CSELZ timing.

As depicted in FIG. 7, an internal write operation substantially starts at a timing t10 that lags slightly behind the clock clk1.5. Therefore, compared to the start of an internal write operation at clock clk2 as depicted in FIG. 3, as depicted in the center of FIG. 7, an internal write operation of the present embodiment can be started earlier by time ΔT. To perform an internal write operation at a fast timing like this, as described above, column address processing must be started early in line with clock clk1 timing. In the example depicted in FIG. 3, column address processing is performed at or after clock clk2.

FIG. 8 depicts a timing chart showing the phase of a data strobe signal DS lagging a clock clk1 by time tDSH. In this case, the operation of the configuration depicted in FIG. 6 is the same as that depicted in FIG. 7. As depicted in FIG. 8, column address processing is performed in advance in accordance with clock clk1 timing. Then, an initial write data signal D0 is latched at the rising edge of a data strobe signal DS delayed time tDSH from the clock clk1 (first data strobe signal DSPZ), and a second write data signal D1 is latched at the falling edge (second data strobe signal DSPX). Then, having that second data strobe signal DSPX as a starting point, an internal write operation commences from time t10.

Therefore, for FIG. 8, the internal write operation starts at the same time as that depicted in FIG. 3. But, in FIG. 3, as depicted in FIG.'s 4 and 5, since redundancy comparison operations and predecoding operations are performed as indicated by t20 in the figures after the start of an internal write operation at time t10, comparison result signals COMZO, COMZE and predecoded signals PCAxxZO, PCAxxZE, which are the results thereof, are generated thereafter. By contrast to that, in the case of the memory depicted in FIG. 6, as depicted in FIG. 8, redundancy comparison operations and predecoding operations are performed, as indicated by t20 in the figure, prior to time t10, when the internal write operation starts. Therefore, the comparison result signals COMZO, COMZE and predecoded signals PCAxxZO, PCAxxZE generated by column address signal processing are already generated prior to the start of the internal write operation at time t10. Therefore, the overall time until write completion is shortened.

Since a column address signal is introduced in synchronous with the clock clk1 like this, subsequent thereto, by performing redundancy comparison and predecoding operations for the column address ahead of time at a control timing in synchronous with clock clk1, the processing time for the internal write operation which occurs thereafter can be shortened.

Figure 9:
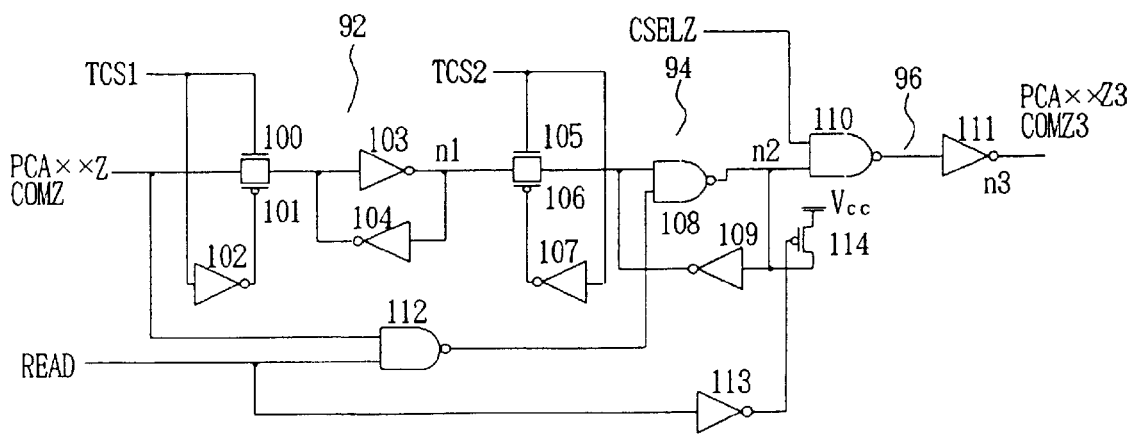
FIG. 9 depicts the circuit configurations of drivers.

FIG. 9 depicts the circuit configurations of drivers 72, 74, 82, 84. Three control signals TCS1, TCS2 CSELZ are applied to the driver circuits depicted in FIG. 6. But the detailed configurations of those drivers are not depicted in the figure. Therefore, FIG. 9 is used to explain their detailed configuration and operation.

As depicted in FIG. 9, three control signals TCS1, TCS2 CSELZ control a latch circuit 92, a latch circuit 94 and an initial stage gate of a final drive circuit 96. A timing control signal TCS1 generated by an internal clock generator 90 is inverted by an inverter 102, and controls an n-type transistor 100 and a p-type transistor 101, which comprise a CMOS transfer gate. That is, a comparison result signal COMZ from redundancy comparators 68, 80 and a predecoded signal PCAxxZ from predecoders 70, 78 are introduced by a timing control signal TCS1, and latched to a latch circuit 92. The latch circuit 92 comprises two inverters 103, 104. The results of a redundancy comparison operation and a predecoding operation are latched into a driver by the timing control signal TCS1 generated from a clock clk1. As a result, the latched result signal COMZ1 and predecoded signal PCAxxZ1 are held in a node n1.

Next, CMOS transfer gates 105, 106 are opened by a second timing control signal TCS2 generated by a write clock generator 58, and the signals in the node n1 are latched to a latch circuit 94. This second timing control signal TCS2 is generated in synchronous with a data strobe signal DS, and latches to a latch circuit 94 a comparison result signal and predecoded signal in line with the start of internal write. Therefore, the latch circuit 94 comprises a transfer circuit function for moving from clock CLK synchronized control to data strobe signal synchronized control. The latch circuit 94 comprises a NAND gate 108 and an inverter 109, and latched result signal COMZ2 and predecoded signal PCAxxZ2 are held in a node n2.

Here, finally, a NAND gate 110 is opened by a column select signal CSELZ generated by a column select pulse generator 58, and a result signal COMZ3 and a predecoded signal PCAxxZ3 are supplied by an inverter 111 to column decoders 24, 25 provided in a memory cell array. That is, the result signal COMZ3 and predecoded signal PCAxxZ3 are output in alignment with write amplifiers 42, 44. Therefore, the internal write operation is controlled in synchronous with a data strobe signal DS.

As described above, with drivers 72, 74, 82, 84, a predecoded signal PCAxxZ and a comparison result signal COMZ are held in a latch circuit 94 by an H level of a second timing control signal TCS2. Then, the predecoded signal PCAxxZ2 and the comparison result signal COMZ2, which are held in the latch circuit 94, are applied to column decoders 24, 25 as a predecoded signal PCAxxZ3 and a comparison result signal COMZ3, respectively, for the duration of an H level of a column select signal CSELZ. Therefore, a second timing control signal TCS2 and a column select signal CSELZ enable an internal write operation at control timing which is in synchronous with a data strobe signal DS. Then, a first timing control signal TCS1 is controlled in synchronous with a clock clk1, and latches to a latch circuit 92 a redundancy comparison result signal generated in advance.

Further, when a read signal READ is H level, NAND gates 112 and 108 open, and a predecoded signal and a comparison result signal are supplied directly to a NAND gate 110. Therefore, at read, timing control signals TCS1, TCS2 are not used, but are simply output to a column decoder at a timing controlled by a column select signal CSELZ.

Figure 10:
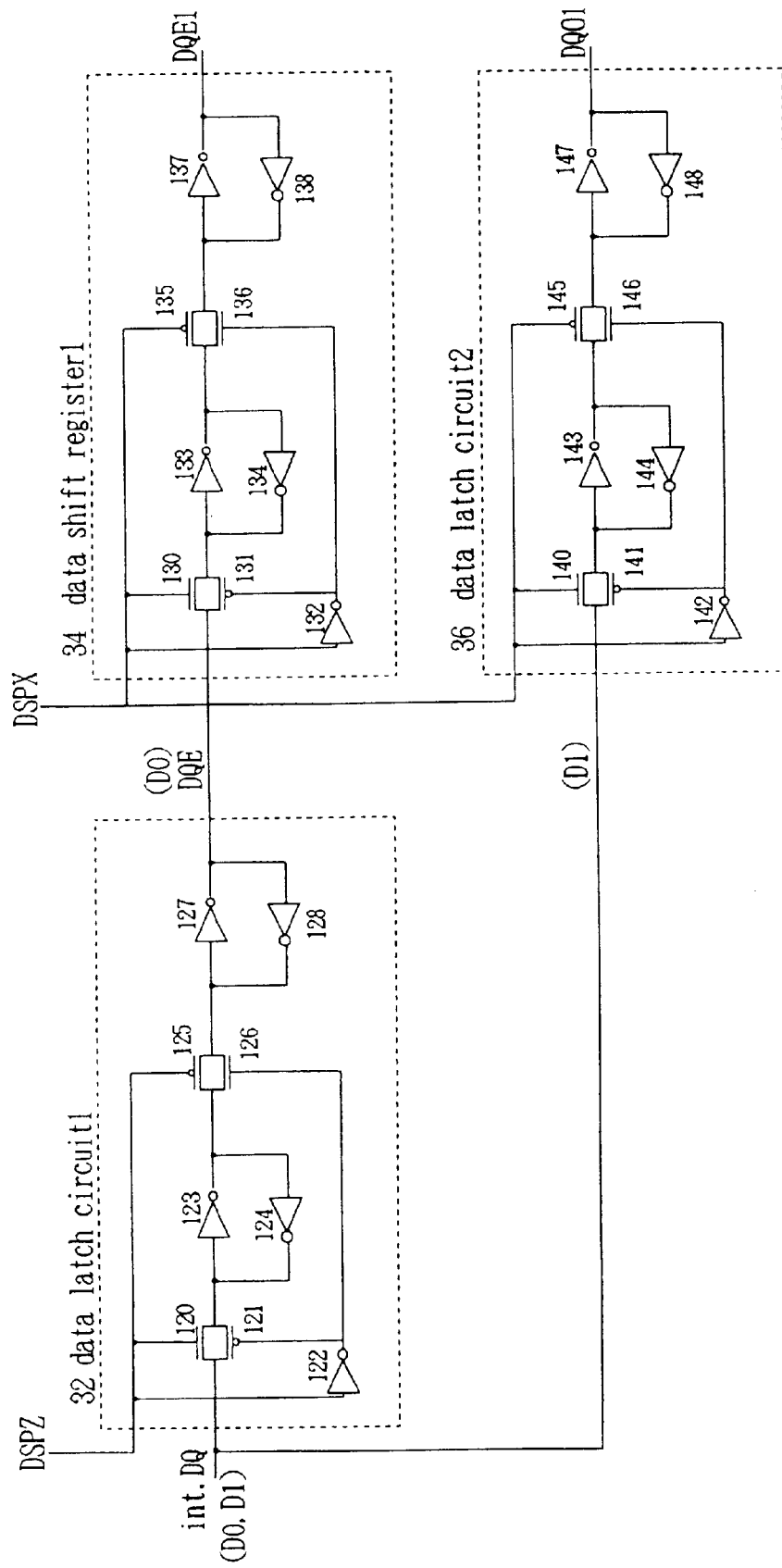
FIG. 10 depicts examples of the detailed circuitry of first and second data latch circuits and a data shift register.

FIG. 10 depicts an example of the detailed circuitry of the first and second data latch circuits 32, 36 and a data shift register 34 depicted in FIG. 6. The first data latch circuit 32, to which an even write data D0, which is input first, is introduced via a first data strobe signal DSPZ, is comprised of a master-slave flip-flop. CMOS gates 120, 121 conduct by an H level of the first data strobe signal DSPZ, and a first write data signal D0 is latched to a latch circuit on the slave side comprising two inverters 123, 124. Then, by an L level of the first data strobe signal DSPZ, CMOS gates 125, 126 conduct, and the first write data signal D0 is held in a latch circuit on the master side comprising two inverters 127, 128.

The configurations of the second data latch circuit 36 and the data shift register 34 are the same as that of the first data latch circuit 32. A second write data D1 is latched to a latch circuit comprising inverters 143, 144 of the second data latch circuit 36 by an H level of a second data strobe signal DSPX in synchronous with a falling edge of a data strobe signal DS. At the same time, a data signal DQE being held by the first data latch circuit 32 is also latched to a latch circuit comprising inverters 133, 134 of the data shift register 34. Then, by an L level of the second data strobe signal DSPX, the respective write data D0, D1 are held in a latch circuit comprising inverters 137, 138, and in a latch circuit comprising inverters 147, 148 in the respective circuits 34, 36. As a result, an even write data signal DQE1 and an odd write data signal DQO1 are generated by the respective circuits 34, 36.

Figure 11:
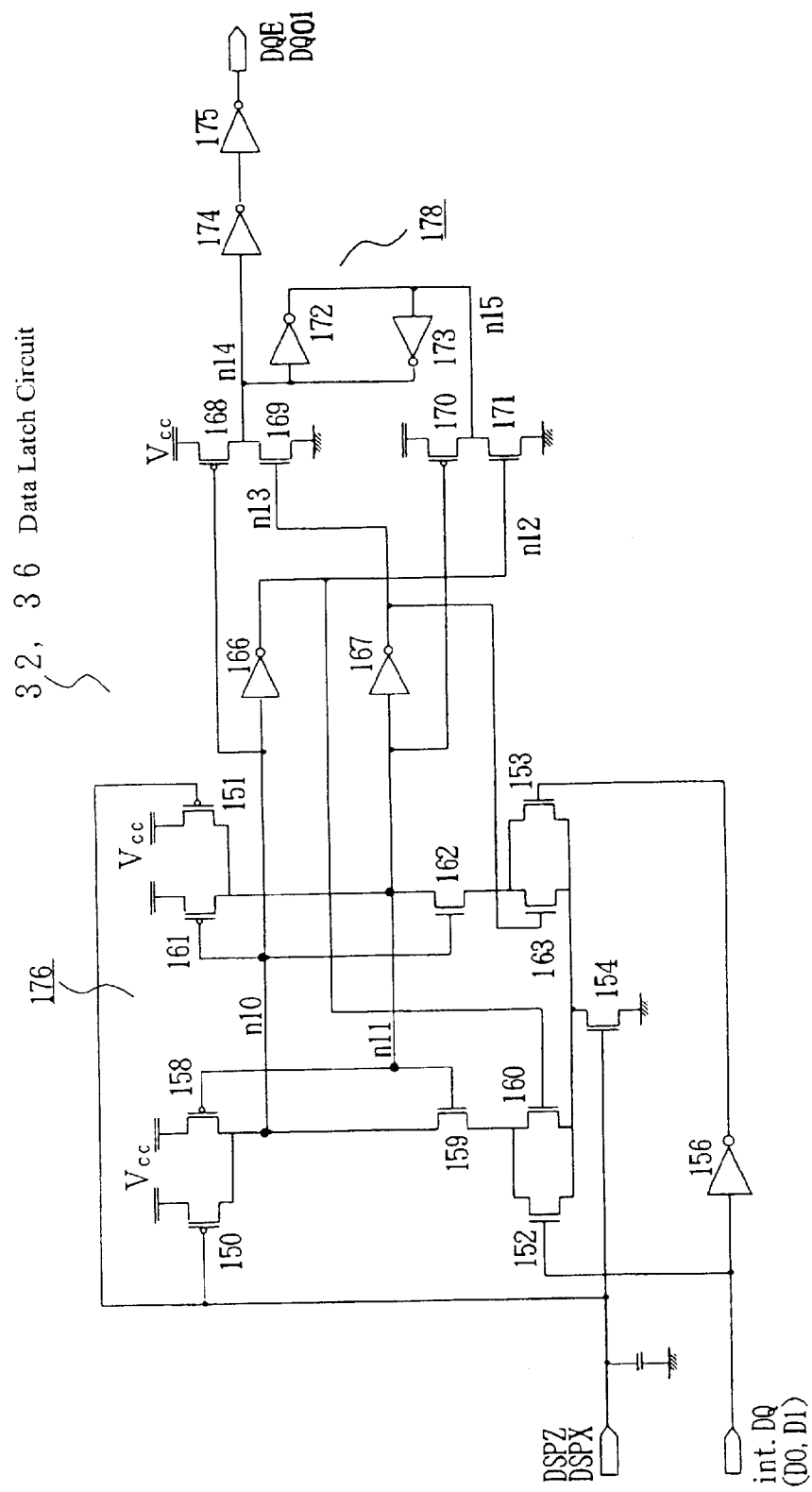
FIG. 11 depicts a separate example of the detailed circuitry of a data latch circuit.

FIG. 11 depicts a another example of the detailed circuitry of data latch circuits 32, 34. This example comprises an initial stage latch circuit 176 and a latter stage latch circuit 178. The initial stage latch circuit 176 comprises p-type transistors 150, 151, 158, 161 and n-type transistors 152, 153, 154, 159, 160, 162, 163. And the latter stage latch circuit 178 comprises two inverters 172, 173.

A simplified explanation of the operation of this data latch circuit follows. During the L levels of control signals DSPZ, DSPX, the data latch circuit is in an inactive state, and there is no current consumption. That is, transistors 150, 152 conduct, and nodes n10, n11 are both H level. As a result, an inverter 166 sets a node n12 to L level, and an inverter 167 sets a node n13 to L level as well. Therefore, transistors 168–171 are all nonconductive, and nodes n14, n15 are in a high impedance state. As a result, the latter stage latch circuit 178 retains the former state.

Next, when write data signals D0, D1 are applied to an internal input-output terminal int. DQ, if control signals DSPZ, DSPX are H level, transistors 150, 151 are nonconductive, a transistor 154 conducts, and a differential amplifier comprising transistors 152, 153, to which write data D0, D1 and inverted signals thereof are applied, is activated. Now, if we assume a write data signal is H level, a transistor 152 conducts, a node n10 transitions to L level and a node n11 transitions to H level. Therefore, a transistor 168 conducts, a transistor 169 does not conduct, and a node n14 transitions to H level. Meanwhile, a transistor 171 conducts, and a node n15 transitions to L level. The signals of these nodes n12, n13 are fed back to transistors 160, 163, and promote the latch of the initial stage latch circuit 176. And the latter stage latch circuit 178 latches that data via nodes n14 and n15.

This data latch circuit only detects write data signals D0, D1 at the rising edges of control signals DSPZ, DSPX, and can latch these write data signals D0, D1 to the latter stage latch circuit 178. Therefore, it is capable of faster operation than the master-slave circuit depicted in FIG. 10 that latches on the basis of control signal rise and fall. Moreover, it is an energy saving type, which consumes current only during a control signal H level.

Figure 12B:
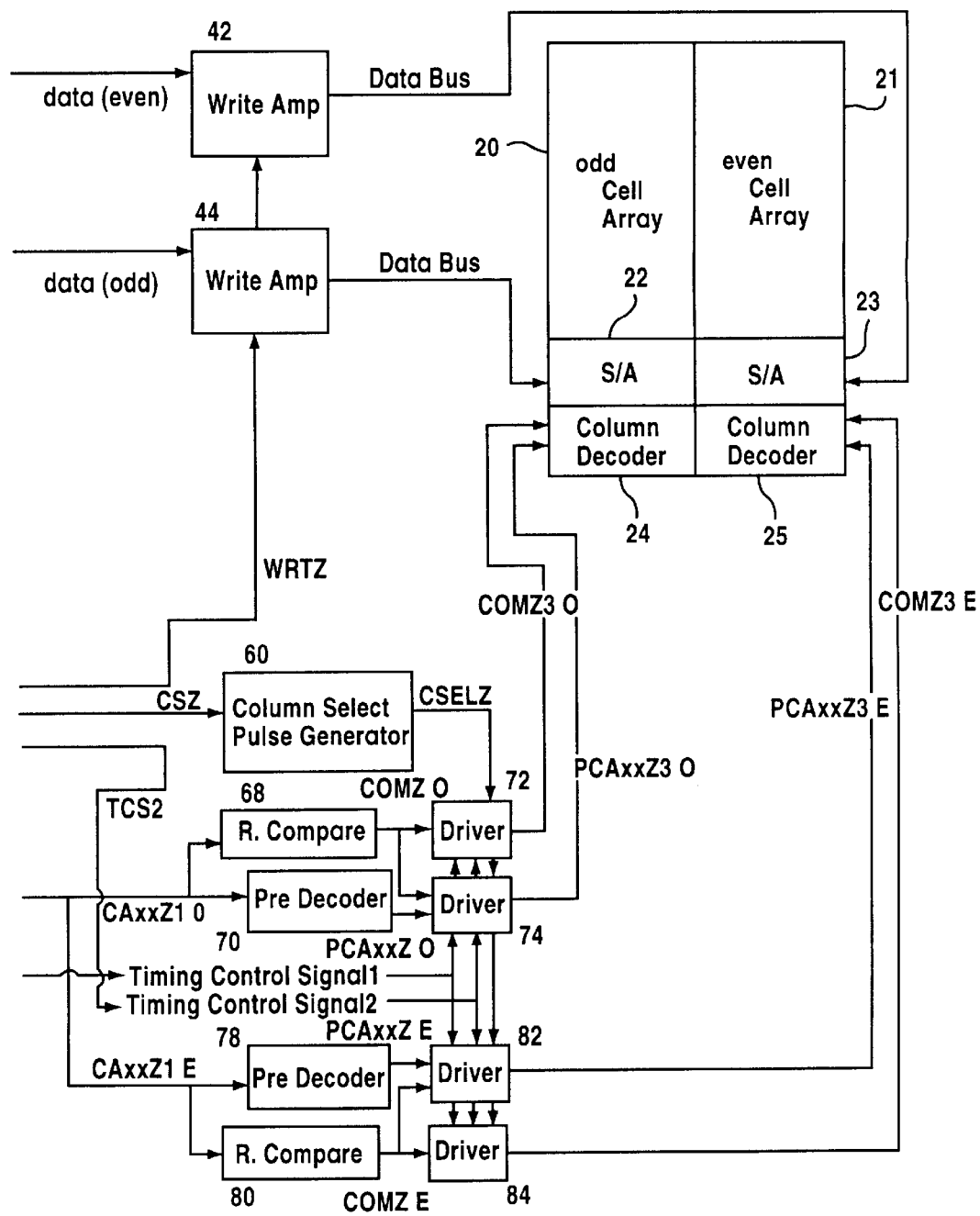
FIG. 12 depicts the simplified configuration of a memory of a second embodiment of the present invention.
Figure 13B:
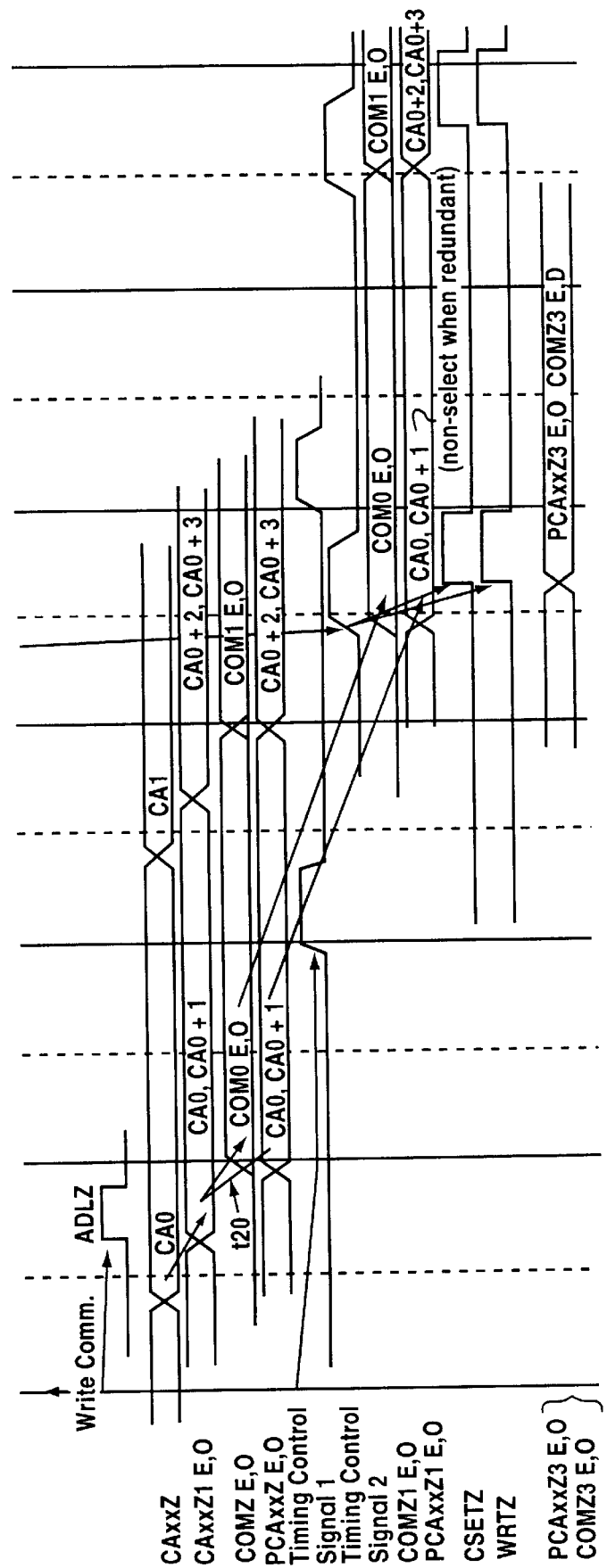
FIG. 13 depicts a flowchart of the operations of the memory depicted in FIG. 12.

FIG. 12 depicts a simplified configuration of a memory of a second embodiment of the present invention. Those parts depicted in FIG. 12 which correspond to similar parts depicted in FIG.'s 3 and 6 have been given the same reference numbers. And FIG. 13 is a flowchart depicting the operation of the memory depicted in FIG. 12. Those parts depicted in FIG. 13 which correspond to similar parts depicted in FIG.'s 7 and 8 have also been given the same reference numbers.

The characteristic point of the circuitry depicted in FIG. 12 is that it is not a specification wherein a write data signal is applied in synchronous with a data strobe signal DS, but rather is a specification wherein a write data signal is applied in synchronous with an external clock CLK.

In general, a column address signal ADDRESS is applied together with a write command signal in synchronous with a rising edge of a clock clk1. Thus, in the memory depicted in FIG. 12, by decoding this write command and recognizing that it is a write mode then by being applied a write data signal to an input-output terminal DQ at the next clock clk2 timing, it is possible to keep the current consumption of an input buffer 30 low. That is, after recognizing a write command, the memory can activate the input buffer 30 with an enable signal EN and wait. Therefore, with this example, write data signals D0, D1 are applied to a data input-output terminal DQ from the system side in synchronous with the rising edge of a clock clk2 and the falling edge of a clock clk2.5.

Therefore, the introduction of a write data signal and the start of an internal write operation in line with that are controlled based on the timing of an internal control signal that has a clock clk2 as its starting point. However, since a column address ADDRESS is input in synchronous with the rising edge of a clock clk1, by performing a redundant address comparison operation and predecoding operation and other column address processing in advance based on a control signal that has a clock clk1 as its starting point, an internal write operation can be started immediately from the point at which subsequently inputted write data signals D0, D1 are latched.

To make the above-described operation possible, a first data strobe signal DSPZ and a second data strobe signal DSPX are generated by a rising edge trigger circuit 50 and a falling edge trigger circuit 56 in response to an internal clock int.CLK which introduced an external clock CLK via a buffer 46. And a write clock generator 58, which controls an internal write operation, is controlled by a second data strobe signal DSPX generated from the abovedescribed clock int.CLK. The generation of a write signal WRT and a column select signal CSELZ by the write clock generator 58 is the same as in the circuitry depicted in FIG. 6.

Furthermore, an internal clock generator 90, at a clock clk1 as its starting point to which a column address ADDRESS is applied, generates an address buffer latch signal ABL, a first timing control signal TCS1, and an address latch signal ADLZ, which outputs even and odd column addresses CAxxZ1O, CAxxZ1E from an internal column address latch & counter. This configuration makes it possible to shave a clock clk1 as a starting point, and to perform in advance redundant address comparison operations in redundancy comparators 68, 80, and predecoding operations in predecoders 70, 78.

The operations of drivers 72, 74, 82, 84 are the same as those described with reference to FIG. 6 and FIG. 9. Redundancy comparison result signals COMZO, COMZE and predecoded signals PCAxxZO, PCAxxZE are latched based on a first timing control signal TCS1, these same signals are again latched on the basis of a second timing control signal TCS1 TCS2, and then these signals COMZ3O, COMZ3E and PCAxxZ3O, PCAxxZ3E are output to column decoders 24, 25 at column select signal CSELZ timing.

As indicated in the operational timing chart depicted in FIG. 13, a column address signal is introduced at clock clk1 timing, and operations are performed in advance in redundancy comparators 68, 80 and predecoders 70, 78 at the time indicated by t20 in the figure. Then, write data signals D0, D1 are introduced sequentially at clock clk2 timing, and an internal write operation starts from time t10. More specifically, write signals WRT are applied to write amplifiers 42, 44, and a column select signal CSELZ is applied to drivers 72, 74, 82, 84. Since redundancy comparison and other such operations were performed in advance, an internal write operation can start based on a column select signal CSELZ immediately following the introduction of write data signals.

FIG. 14 depicts the detailed circuitry of an input buffer 30 connected to a data input-output terminal DQ. This input buffer detects the H level or L level of a write data signal based on externally-applied write data signals D0, D1 and a reference signal Vref, and converts it to a CMOS level. A current mirror circuit is comprised of p-type transistors 180, 181, and a differential amplifier is comprised of transistors 182, 183, which treat that current mirror circuit as a load. Then, a power source transistor 184 conducts on the basis of an enable signal EN generated by a command decoder 189, activating a differential amplifier. Control signals /RAS, /CAS, /CS1, /WE are applied to a command decoder 189, and a write command is applied based on combinations of these control signals.

When a command decoder 189 detects a write command applied from a combination of control signals, it sets an enable signal EN to H level, activates an input buffer 39 and waits for write data signals to be received. Therefore, since an input buffer 30 is only activated at write, power consumption can be greatly conserved.

Also, waveform shaping is performed by inverters 185, 186, 187, and an internal write data signal int. DQ converted to CMOS level is generated.

Figure 15B:
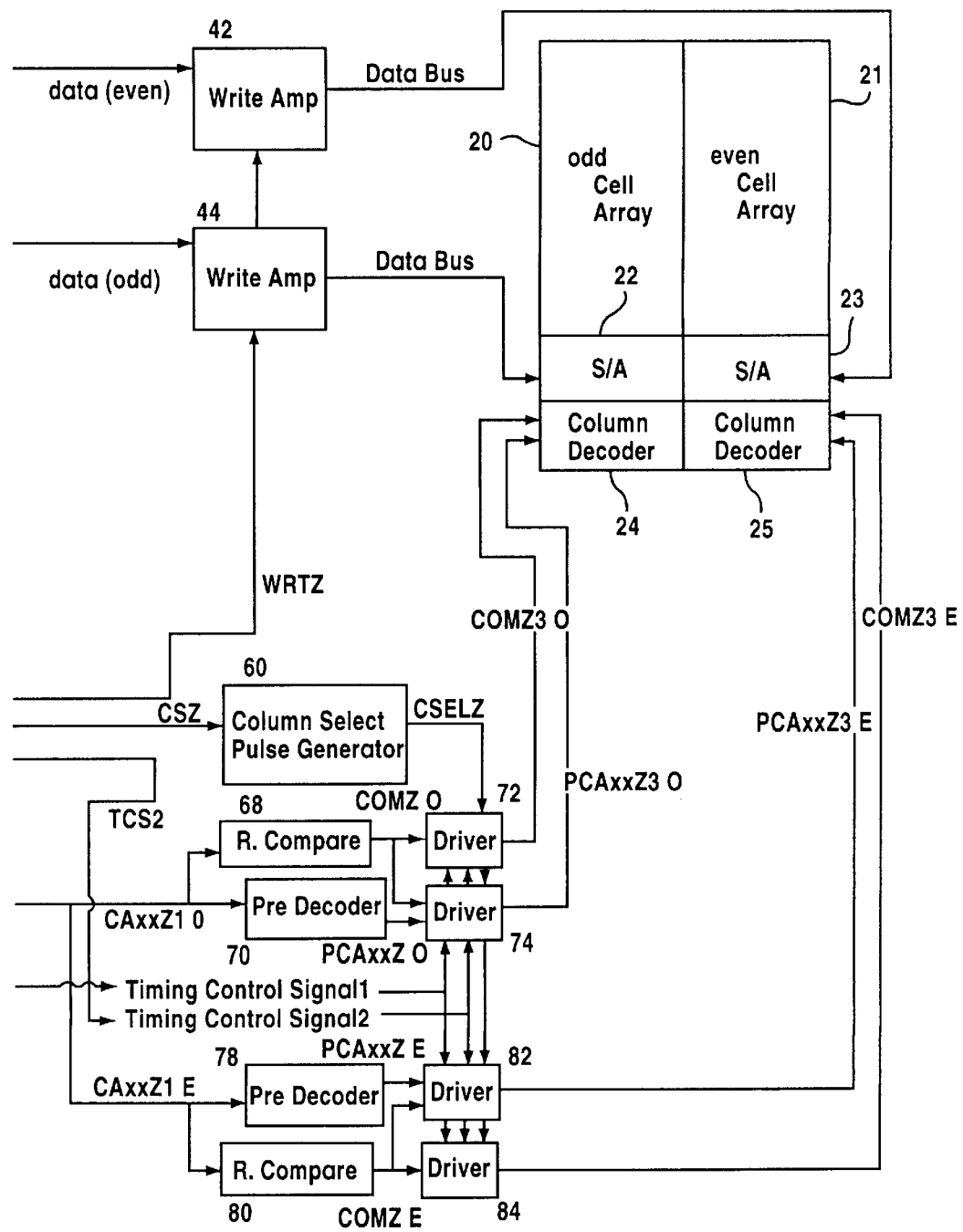
FIG. 15 depicts an improved example of the second embodiment depicted in FIG. 12.

FIG. 15 depicts an example of an improved second embodiment depicted in FIG. 12 described above. This example uses a delayed locked loop circuit 194 to generate an internal clock int. CLK from an external clock CLK.

This delayed locked loop circuit 194 is a circuit which generates an internal clock int.CLK, which is in synchronous and in phase with a clock CLK input from an input buffer 46. The delayed locked loop circuit 194 comprises a delay circuit 196, a delay control circuit 198, which controls the amount of delay of this delay circuit 196, and a phase comparator 199. Then, it further comprises a dummy buffer 200.

This delayed locked loop circuit 194 is well known, and its basic operating principle is to compare via a phase comparator the phase of an external clock CLK with that of an internal clock int.CLK, and to control via a delay control circuit 198 the amount of delay of a delay circuit 196 so that the phases of both clocks match up. Since a dummy buffer 200 comprises the same delay characteristics as an input buffer 46, the internal clock int.CLK, for instance, can be in phase with the external clock CLK while being one cycle behind it. Since the clocks repeatedly transition from H level to L level one after the other, outwardly, the external clock CLK and the internal clock int.CLK have exactly the same phase. That is, as indicated by the dotted lines depicting the internal clock int.CLK in FIG. 13, it becomes the same clock as the external clock.

When such an internal clock is used to generate a data strobe signal DSPZ in synchronous with a clock rising edge, and a data strobe signal DSPX in synchronous with a clock falling edge, the latch timing of a data latch circuit 190 can be made faster than that depicted in FIG. 13. In the example depicted in FIG. 15, a data input-output terminal DQ is not connected to a data latch circuit via an input buffer 30 as in the example depicted in FIG. 12, but rather is connected directly to data latch circuits 190, 192. Therefore, these latch circuits also comprise input buffer functions.

Other than that, the example depicted in FIG. 15 is the same as that depicted in FIG. 12, and corresponding circuits have the same reference numbers. That is, a column address is introduced, and everything up to a redundancy comparison operation is performed based on clock clk1 timing. Meanwhile, write data D0, D1 are introduced from a data input-output terminal DQ at clock clk2 timing, and a write operation is performed.

Figure 16:
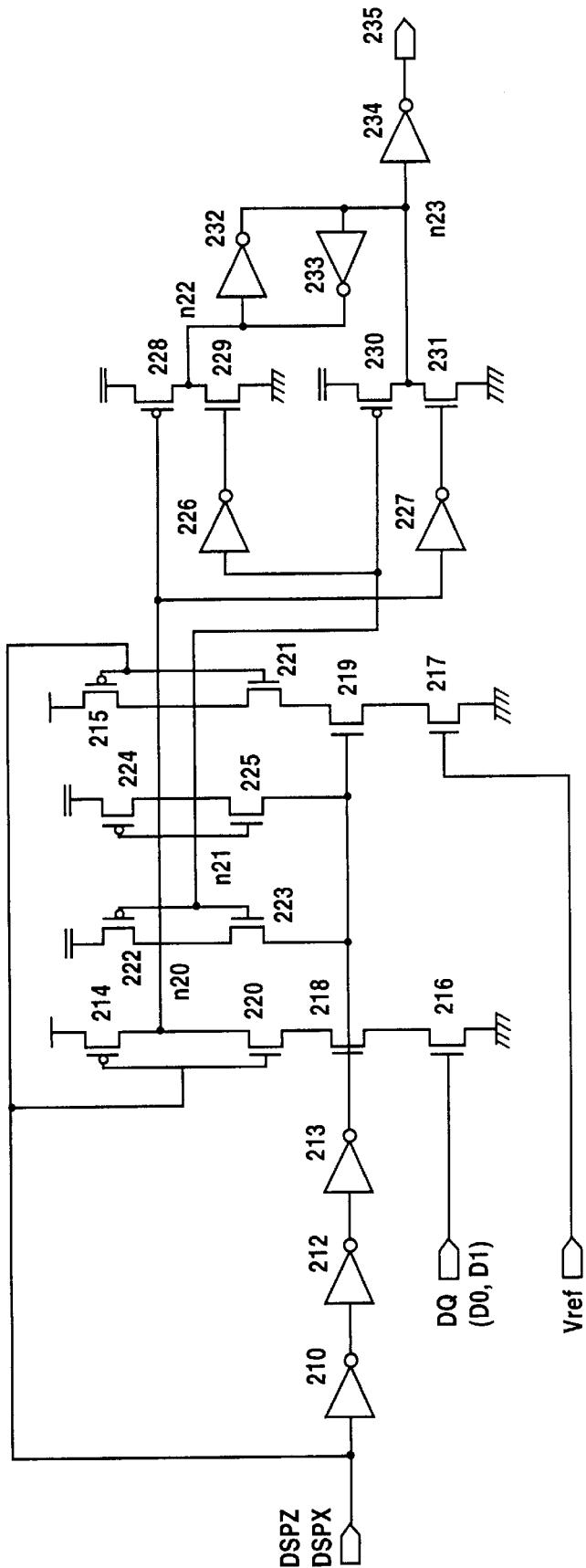
FIG. 16 depicts examples of the circuitry of the data latch circuits depicted in FIG. 15.

FIG. 16 depicts an example of the circuitry of the data latch circuits 190, 192 depicted in FIG. 15. An external clock CLK, as well as an external reference voltage Vref are applied to this data latch circuit. Then, as control clocks, data strobe signals DSPZ, DSPX are applied. During the L level of a control clock, p-type transistors 214, 215 are in a conductive state, and nodes n20, n21 are both retained at H level. This makes transistors 228–231 nonconductive, and sets nodes n22, n23 in a high impedance state.

Thus, when the control clocks DSPZ, DSPX transition to H level, transistors 214, 215 become nonconductive, n-type transistors 218, 219 enter a conductive state, and a buffer operation is performed by a differential circuit comprising transistors 216, 217 to determine whether write data signals D0, D1 are higher or lower than a reference voltage Vref. In accordance with that, one of the nodes n20, n21 transitions from H level to L level. For example, if a write data signal is H level, a transistor 216 conducts and a node n20 transitions to L level.

In line with this, a transistor 228 conducts, a node n22 transitions to H level, a transistor 231 conducts, and a node n23 transitions to L level. The states of these nodes are latched by a latch circuit comprising inverters 232, 233.

That is, since the data latch circuit depicted in FIG. 16 is controlled by fast timing data strobe signals DSPZ, DSPX generated from an internal clock in phase with an external clock CLK, it comprises a buffer function, as well as a function, which latches at high speed inputted write data signals based solely on the rising edges of control clocks DSPZ, DSPX. Therefore, it is suitable for use as the data latch circuit depicted in FIG. 15.

Figure 17B:
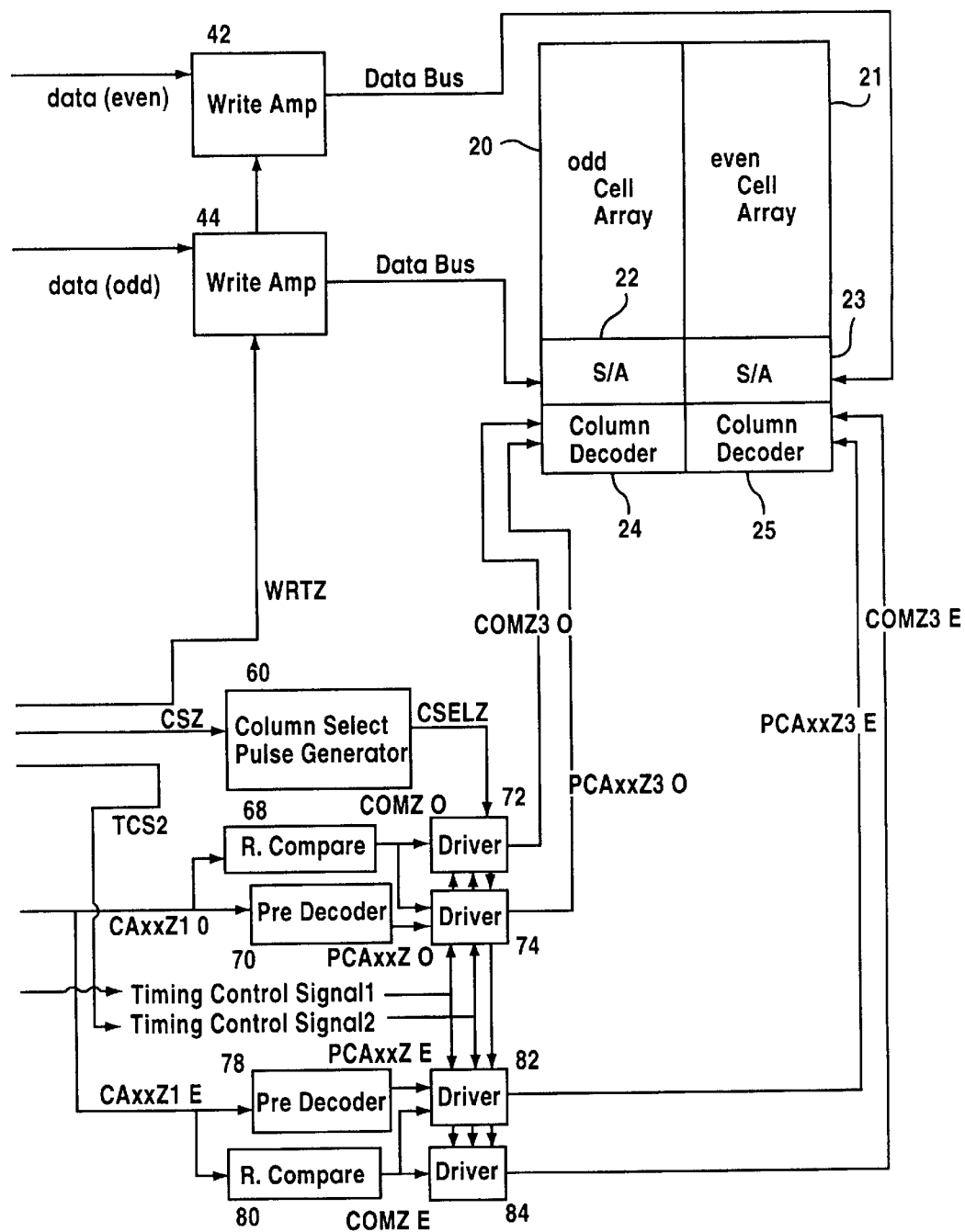
FIG. 17 depicts a separate improved example of the second embodiment depicted in FIG. 12.

FIG. 17 depicts a separate improved example of the second embodiment depicted in FIG. 12 described above. This example also makes use of a delayed locked loop circuit to generate an internal clock int.CLK from an external clock CLK. In addition, in this example, a single data latch circuit 190 is provided for a data input-output terminal DQ, write data signals D0, D1 are introduced time-sequentially by data strobe signals DSPZ, DSPX, and an even write data signal DQE1 is separated from an odd write data signal DQO1 by a demultiplexer 202.

The data latch circuit 190 has the same configuration as the data latch circuit depicted in FIG. 15. Then, in the demultiplexer 202, data latched by the data latch circuit 190 in response to control signals DDSPZ, DDSPX, which delayed data strobe signals DSPZ, DSPX, respectively, are divided into even and odd write data DQE1 and DQO1.

Figure 18:
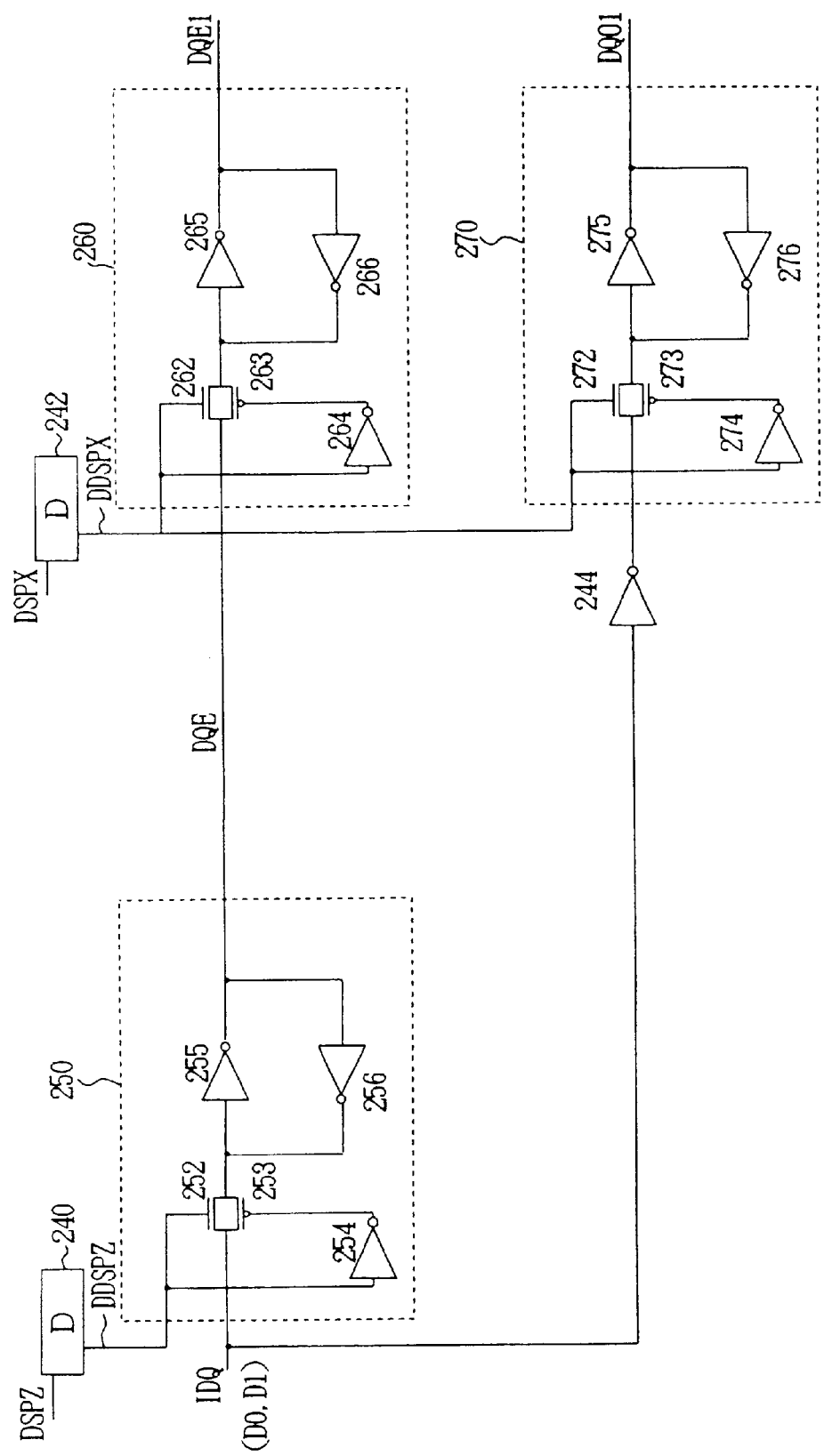
FIG. 18 depicts an example of a demultiplexer.

FIG. 18 depicts an example of this demultiplexer. This circuit comprises three latch circuits 250, 260, 270. In this demultiplexer, internal data IDQ latched by a data latch circuit 190 is latched to a latch comprising inverters 255, 256 inside a latch circuit 250 by a control signal DDSPZ, which delays a first data strobe signal DSPZ. Then, based on a control signal DDSPX, which delays a second data strobe signal DSPX, CMOS gates 262, 263 and 272, 273 conduct, a second write data signal D2 is latched to a latch comprised of inverters 275, 276 inside a latch circuit 270, and data DQE(D1), which had been latched into a latch circuit 250, is latched to a latch comprising inverters 265, 266 inside a latch circuit 260.

The memory depicted in FIG. 17, outside of being provided with the above-described demultiplexer, has the same configuration as the memory depicted in FIG. 15. Therefore, corresponding locations have the same reference numbers. Also, the data latch circuit 190 and demultiplexer 202 depicted in FIG. 17 and FIG. 18 are not restricted to the second embodiment depicted in FIG. 12, but rather can be applied in place of the buffer 30 and data shift registers 34, 36 of the first embodiment depicted in FIG. 6.

The above-described embodiments were explained using a synchronous DRAM as an example, but the present invention is not restricted to synchronous DRAM, and can be widely utilized in memory, wherein addresses and other signals are applied in synchronous with an external clock.

As explained above, by virtue of the present invention, in memory which makes use of an external clock and an external data strobe signal asynchronous thereto, because an internal write operation can be started immediately following the input of a write data signal responsive to an external data strobe signal, write operations can be speeded up. In addition, write operations can be further speeded up by performing redundancy comparison operations on address signals applied in synchronous with an external clock without waiting for an internal write operation.

Further, in a memory, wherein an address and a command are supplied in synchronous with a first external clock, and a write data signal is supplied in synchronous with a second external clock subsequent to a first external clock, since a redundancy comparison operation is performed subsequent to inputting an address signal in synchronous with a first external clock, the time required for an internal write operation can be shortened.

What is claimed is:

1. A semiconductor memory device, which receives at least an address signal in synchronous with an externally-supplied external clock, comprises:
    a memory cell array, comprising a plurality of memory cells that store data;
    a data signal input circuit for holding a write data signal supplied in synchronous with an externally-supplied external data strobe signal in response to an internal data strobe signal which is generated in response to said external data strobe signal; and
    a write circuit for, in response to a write signal generated later than said internal data strobe signal in response to said external data strobe signal, supplying to said memory cell array a write data signal held by said data signal input circuit.

2. The semiconductor memory device according to claim 1, further comprising a driver for, in response to a column select signal generated later than said internal data strobe signal in response to said external data strobe signal, providing said address signal to a column decoder corresponding to said memory cell array.

3. The semiconductor memory device according to claim 1, further comprising
    a redundancy comparator for comparing a defective address corresponding to a defective cell in said memory cell array to said address; and
    an address latch for supplying a supplied address signal to said redundancy comparator in response to an address latch signal generated in response to said external clock.

4. The semiconductor memory device according to claim 3, further comprising a driver for, in response to a column select signal generated later than said internal data strobe signal in response to said external data strobe signal, supplying a comparative output signal of said redundancy comparator to a column decoder corresponding to said memory cell array.

5. The semiconductor memory device according to claim 4, wherein said driver holds said comparative output signal of said redundancy comparator in response to a control signal generated in response to said external clock.

6. The semiconductor memory device according to claim 1, further comprising a predecoder for predecoding said address, and an address latch circuit for supplying said address to said predecoder in response to an address latch signal generated in response to said external clock.

7. The semiconductor memory device according to claim 6, further comprising a driver for, in response to a column select signal generated later than said internal data strobe signal in response to said external data strobe signal, supplying a predecoded signal of said predecoder to a column decoder corresponding to said memory cell array.

8. The semiconductor memory device according to claim 7, wherein said driver holds said predecoded signal of said predecoder in response to a control signal of said generated in response to said external clock.

9. A semiconductor memory device, which receives at least an address signal in synchronous with an externally-supplied external clock, comprises:
    a first and second memory cell array, comprising a plurality of memory cells that store data;
    a data signal input circuit for holding a first and second write data signal each supplied in synchronous with a first edge and second edge subsequent thereto of an externally-supplied external data strobe signal, in response to a first and second internal data strobe signal each generated in response to said first and second edge of said external data strobe signal; and a write circuit for, in response to a write signal generated later than said second internal data strobe signal in response to said external data strobe signal, supplying to said memory cell array a write data signal held by said data signal input circuit.

10. The semiconductor memory device according to claim 9, further comprising a redundancy comparator for comparing a defective address corresponding to a defective cell in said memory cell array to said address; and an address latch for, in response to an address latch signal generated in response to said external clock, supplying said address signal and a second address signal generated from the address signal to said redundancy comparator.

11. The semiconductor memory device according to claim 10, further comprising a driver for, in response to a column select signal generated later than said second internal data strobe signal in response to said external data strobe signal, supplying a comparative output signal of said redundancy comparator to a column decoder corresponding to said memory cell array.

12. A semiconductor memory device, which receives at least a command signal and an address signal in synchronous with an externally-supplied external clock, said command signal and address signal being supplied in synchronous with a first clock of said external clock, comprises:

a memory cell array, comprising a plurality of memory cells that store data;

a redundancy comparator for comparing a defective address corresponding to a defective memory cell of said memory cell array to supplied address;

a data input circuit for, in response to an internal data strobe signal generated in response to a second clock supplied after said first clock of said external clock, holding an externally-supplied write data signal;

a write circuit for, in response to a write signal generated later than said internal data strobe signal in response to said second clock, supplying to said memory cell array said write data signal held by said data input circuit; and an address latch circuit for, in response to an address latch signal generated in response to said first clock, supplying said address signal to said redundancy comparator.

13. The semiconductor memory device according to claim 12, further comprising a driver for, in response to a column select signal generated later than said internal data strobe signal responsive to said second clock, supplying a comparative output of said redundancy comparator to a column decoder corresponding to said memory cell array.

14. The semiconductor memory device according to claim 12, further comprising a predecoder for predecoding said address signal, and a driver for, in response to a column select signal generated later than said internal data strobe signal responsive to said second clock, supplying a predecoded signal of said predecoder to a column decoder corresponding to said memory cell array.

15. The semiconductor memory device according to claims 12, 13, or 14, further comprising a delayed locked loop circuit for generating an internal clock phase synchronized with said external clock, wherein said internal data strobe signal and address latch signal are generated on the basis of said internal clock.

16. A semiconductor memory device, which receives at least a command signal and an address signal in synchronous with an externally-supplied external clock, said command signal and address signal are supplied in synchronous with a first clock of said external clock, comprises:

a first and second memory cell arrays, comprising a plurality of memory cells that store data;

a redundancy comparator for comparing a defective address corresponding to a defective memory cell of said memory cell array to a supplied address;

a data input circuit for holding a first and second write data signal each supplied in synchronous with a first edge and second edge subsequent thereto of a second clock supplied after said first clock of said external clock, in response to a first and second internal data strobe signal each generated in response to said first and second edge of said second clock;

a write circuit for, in response to a write signal generated later than said second internal data strobe signal in response to said second clock, supplying to said memory cell array said write data signal held by said data input circuit; and an address latch circuit for, in response to an address latch signal generated in response to said first clock, supplying said address signal to said redundancy comparator.

17. The semiconductor memory device according to claims 12, 13, 14 or 16, further comprising a command decoder for decoding said command, and generating an enable signal that activates a buffer, which receives said write data signal.

18. The semiconductor memory device according to claim 16, further comprising a delayed locked loop circuit for generating an internal clock phase synchronized with said external clock; wherein said first and second internal data strobe signal and address latch signal are generated on the basis of said internal clock.

19. The semiconductor memory device according to claims 9 or 16, wherein said data input circuit comprises a data latch circuit for holding, in one time, said first and second write data supplied time-sequentially from external, and a demultiplexer for latching to a first internal latch circuit and a second internal latch circuit, respectively, said first and second write data held by said data latch circuit.

20. The semiconductor memory device according to claims 9 or 16, wherein said write circuit comprises a first write circuit for supplying said first write data to said first memory cell array and a second write circuit for supplying said second write data to said second memory cell array.

* * * * *